(12) United States Patent
Dent

(10) Patent No.: US 6,236,275 B1
(45) Date of Patent: *May 22, 2001

(54) DIGITAL FREQUENCY SYNTHESIS BY SEQUENTIAL FRACTION APPROXIMATIONS

(75) Inventor: Paul W. Dent, Pittsboro, NC (US)

(73) Assignee: Ericsson Inc., Research Triangle Park, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/957,173

(22) Filed: Oct. 24, 1997

(51) Int. Cl.$^7$ .................................................. H03L 7/08
(52) U.S. Cl. ............................ 331/1 A; 331/18; 331/16; 331/17; 327/157; 327/159; 327/107; 327/106
(58) Field of Search ..................... 331/1 A, 17, 18, 331/16; 375/376; 327/106, 107, 156, 157, 159, 162

(56) References Cited

U.S. PATENT DOCUMENTS

| | | | |
|---|---|---|---|
| 4,179,670 | 12/1979 | Kingsbury | 331/10 |
| 4,185,247 | 1/1980 | Harrison, Jr. . | |
| 5,021,754 | 6/1991 | Shepherd et al. | 332/128 |
| 5,095,288 | 3/1992 | Dent | 331/17 |
| 5,180,993 | 1/1993 | Dent | 331/16 |
| 5,349,310 | 9/1994 | Rieder et al. | 331/18 |
| 5,420,545 | * 5/1995 | Davis et al. | 331/17 |
| 5,461,344 | * 10/1995 | Andoh | 331/1 A |
| 5,576,666 | 11/1996 | Rauvola | 331/25 |

FOREIGN PATENT DOCUMENTS

| | | |
|---|---|---|
| 2097206A | 10/1982 | (GB) . |
| 2320823A | 7/1998 | (GB) . |

* cited by examiner

*Primary Examiner*—Arnold Kinkead
(74) *Attorney, Agent, or Firm*—Coats & Bennett, PLLC

(57) ABSTRACT

A fractional synthesis approach and arrangement are presented which achieve fine frequency resolution with low phase noise while at the same time retaining a high phase comparison frequency/fast frequency changing speed. An output signal having a desired output frequency is generated by a voltage controlled oscillator (VCO). An output divider divides the output frequency by an output divisor N to produce an output pulse train. The output divisor N may be equal to an output integer N or the output integer plus one N+1, for example, and may change during the generation of a single output frequency. For different desired output frequencies, the value of the output integer N may be varied. A reference divider divides a reference frequency by a reference divisor M to produce a reference pulse train. The reference divisor M may be equal to a reference integer M or the reference integer plus one M+1, for example, and may change during the generation of a single output frequency. A fractional controller may vary the value of the divisor M between successive pulses from the reference divider to produce a mean output pulse frequency having a non-integral relationship to the reference frequency. A phase error detector compares the pulse trains and generates a phase error signal. This signal, which may be filtered or other wise processed, controls the VCO to produce the output signal at the desired output frequency.

62 Claims, 8 Drawing Sheets

DIGITAL FREQUENCY SYNTHESIS BY SEQUENTIAL FRACTION APPROXIMATIONS

BACKGROUND OF THE INVENTION

The invention relates generally to digital frequency synthesis, and in particular, to digital frequency synthesis wherein frequencies may be changed rapidly with high resolution and minimal phase modulation.

Synthesis is the making up of a whole by combining separate parts or elements, and frequency synthesizers produce a range of output frequencies using this principle. Early frequency synthesizers used multiple crystals and contained as many crystal oscillators as frequency decades. Due to advances in various technologies, these multi-crystal synthesizers have now been superseded by single crystal synthesizers.

Direct synthesizers add and subtract multiples and submultiples of a single crystal oscillator frequency to provide a wide range of output frequencies. One such synthesizer is a multi-loop synthesizer which works on a "divide-and-add" principle. For example, if a 1 KHz output frequency is divided by 10 using a digital counter, the result is 100 Hz frequency resolution at one tenth the 1 KHz output frequency. Using a conventional heterodyne frequency converter or "mixer", the resulting 100 Hz frequency may be added to the 1 KHz output frequency to generate successive 100 Hz steps. The 100 Hz frequency may also be divided by 10 to yield 10 Hz steps. These 10 Hz steps may then be added and/or subtracted to any of the preceding frequencies. Unfortunately, direct synthesizers suffer some serious drawbacks including generation of unwanted frequencies by the mixers requiring extensive filtering, a high sensitivity to wideband phase noise, complex circuitry, and a relatively high manufacturing cost.

The required frequency range in most current synthesizers is obtained using a variable voltage-controlled oscillator (VCO) whose output frequency is corrected by comparison with a reference frequency. This type of synthesizer is oftentimes referred to as an indirect synthesizer.

A block diagram of a known phase-locked loop (PLL) digital frequency synthesizer 10 is shown in FIG. 1. The frequency synthesizer 10 includes a reference frequency source/oscillator 12, a reference divider (divide-by-M) 14, a phase error detector 16, a loop filter 18, a voltage-controlled oscillator (VCO) 20, and a variable VCO divider (divide-by-N) 22. The VCO divider 22 may comprise a digital counter that generates a series of count pulses. A VCO output signal at an output frequency $F_{vco}$ is generated by the VCO 20 and is detected by the VCO divider 22. As those skilled in the art will readily comprehend, the output frequency $F_{vco}$ is used herein to designate a frequency which is typically changing in a predetermined manner. Thus, the output frequency $F_{vco}$ may represent one or more distinct, desired frequencies or may represent a range of desired frequencies. The VCO divider 22 counts the number of cycles of the VCO output signal and produces an output pulse after every N cycles, where N is a programmable divisor that can be varied between different count cycles. The VCO divider 22 therefore produces output pulses at a frequency of the output frequency $F_{vco}$ divided by the divisor N.

In order to synthesize multiple different frequencies from the VCO 20, the VCO divider 22 is programmed to divide by different output divisors N whose value is variably set by a control mechanism 23 based on a desired value for the output frequency $F_{vco}$. In a typical application, the desired value of the output frequency $F_{vco}$ may be one of many possible radio frequency (RF) channels for RF transmission or RF reception. Of course, if the variable output divisor N is equal to 1, the VCO divider 22 would output count pulses forming an output pulse train having a frequency substantially identical to the current value of the output frequency $F_{vco}$.

The output pulse train generated by the VCO divider 22 is fed back to the phase error detector 16 for comparison with a reference frequency $F_{ref}$. The reference frequency $F_{ref}$ is usually a fixed, accurate frequency generated by a crystal oscillator; but in some cases, it is a variable frequency derived from some other source that may include another frequency synthesizer. Since the reference frequency source 12 generates a reference frequency $F_{ref}$ that is usually higher than the desired step size between frequencies generated by the VCO 20, the reference frequency $F_{ref}$ is transformed by the reference divider 14 into a reference pulse train having a frequency corresponding to the desired step size. The reference divider 14 divides the reference frequency $F_{ref}$ by a reference integer M. The reference integer M is selected so that the phase detector 16 is able to compare the reference pulse train and the output pulse train generated by the VCO divider 22.

The difference/error in phase or frequency between the compared pulse trains is output as a phase error signal (typically a voltage) by the phase detector 16. The phase error signal is filtered by the loop filter 18 to produce an output error, or control, signal. The loop filter 18 is typically a low-pass filter. The characteristics of the loop filter 18 govern how the PLL responds to changes in the phase error signal. The VCO 20 is a sinusoidal oscillator whose frequency is controlled by the output error signal. A negative value for the output error signal causes the VCO 20 to decrease the output frequency $F_{vco}$ and a positive value for the output error signal causes the VCO 20 to increase the output frequency $F_{vco}$.

In this way, the VCO 20 may be tuned through a wide range of desired values for the output frequency $F_{vco}$ simply by varying the output error signal. By continuously comparing the output frequency $F_{vco}$ of the VCO 20 with a reference frequency $F_{ref}$ having a desired accuracy and, in response thereto, continuously correcting the output error signal, the frequency synthesizer 10 can achieve a very high accuracy. Indeed, the accuracy of the frequency synthesizer 10 can be on the order of one part per million or better, which is typically the accuracy of the reference frequency source 12.

As mentioned above, the reference frequency $F_{ref}$ generated by the reference frequency source 12 is usually not equal to the output frequency $F_{vco}$ to which the VCO 20 is currently tuned; otherwise, the reference frequency source 12 could be used directly to generate the output frequency $F_{vco}$. Because the reference frequency $F_{ref}$ and the desired value of the output frequency $F_{vco}$ typically differ, they must first be reduced by division to some common submultiple frequency before they can be compared. For example, suppose a desired range of the output frequency $F_{vco}$ includes a series of frequencies spaced apart by frequency steps of 25 KHz, for example, 1000.000 MHz, 1000.025 MHz, 1000.050 MHz . . . , and the reference frequency $F_{ref}$ is 12.8 MHz. The reference frequency $F_{ref}$ would need to be divided by 512 (the reference integer M equal to 512) by the reference divider 14 to generate a reference pulse train having a frequency of 25 KHz which is the spacing between the desired series of output frequencies $F_{vco}$. For this example, the reference divider 14 may be comprised of a 9-stage binary counter ($2^9$=512) to produce such a reference pulse train.

The output frequency $F_{vco}$ of the VCO 20 is divided by the variable output divisor N in the VCO divider 22. The variable output divisor N is set to one of the numbers in the series 40000, 40001, 40002 . . . corresponding to the desired output frequency $F_{vco}$ expressed in multiples of 25 KHz, i.e., 1000.000 MHz/40000=25 KHz, 1000.025 MHz/40001=25 KHz, 1000.050 MHz/40002=25 KHz . . . If the output frequency $F_{vco}$ is at the desired value, the VCO divider 22 will generate pulses at the same 25 KHz rate as the reference divider 14. Any difference between the frequencies of the reference pulse train and the output pulse train is detected by the phase detector 16 which generates an appropriate phase error signal, or voltage, to correct the output frequency $F_{vco}$.

In many frequency synthesizer applications, relatively small frequency steps, or fine resolution, in the output frequency $F_{vco}$ is desired. The minimum frequency steps, or resolution, between different values of the output frequency $F_{vco}$ is a function of the value of the reference integer M and the reference frequency $F_{ref}$. Consequently, the reference frequency $F_{ref}$ should be minimized and the reference integer M should be large. Unfortunately, as those skilled in the art will readily comprehend, lowering the reference frequency $F_{ref}$ tends to cause the loop to become unstable unless the loop bandwidth is correspondingly narrowed. In particular, loop bandwidth should preferably be an order of magnitude lower than the reference frequency $F_{ref}$ to assure that the loop filter 18 adequately smoothes the phase error signal generated by the phase detector 16. At frequencies within the loop bandwidth, phase jitter, or phase noise, caused by a sudden phase change tends to be corrected by negative feedback in the PLL. Unfortunately, at frequencies outside the loop bandwidth, phase jitter is not corrected and the PLL may become noisy or unstable. A further disadvantage of a PLL with a narrow loop bandwidth is relatively lengthy settling times before the output frequency $F_{vco}$ reaches its desired value. Therefore, in designing a frequency synthesizer the need for fine resolution which requires a narrow loop bandwidth must be balanced with the need for low phase jitter, and the corresponding PLL stability, which requires a wide loop bandwidth. This incompatibility between fine resolution of the output frequency $F_{vco}$ and PLL stability is a significant disadvantage of simple single loop synthesizers.

Returning to the frequency synthesizer 10 of FIG. 1, the frequency of the pulses (in the reference pulse train and the output pulse train) received by the phase error detector 16 is dependent upon the spacing between frequencies in the desired series of output frequencies. This spacing between frequencies is known as "channel spacing" or "frequency resolution". When narrower channel spacing or finer frequency resolution is desired, the pulses received by the phase error detector 16 become proportionally less frequent. For a channel spacing of 100 Hz, pulses from the VCO divider 22 and the reference divider 14 are received at a rate of one pulse per 10 milliseconds (1/100 Hz=10 msec). If a smaller channel spacing is desired, for example 1 Hz, the phase detector 16 only receives one pulse per second (1/1 Hz=1 s). Consequently, the phase detector 16 has only one opportunity per second to measure the phase error between the output pulse train (derived from the current value of the output frequency $F_{vco}$) and the reference pulse train. Because of this relatively long time between phase error measurements, narrow channel spacing may result in an undesirable delay before the frequency synthesizer 10 selects and settles down to a new output frequency with the desired precision. Therefore, there is yet another frequency synthesizer design tradeoff—resolution and speed. Finer frequency resolution also reduces the synthesizer's ability to correct for undesired short-term fluctuations in the output frequency $F_{vco}$ which can arise, for example, from mechanical vibrations.

Frequency changing speed may be decoupled from frequency resolution by varying an output divisor N used to reduce a particular output frequency for comparison to a reference frequency. Such a synthesizer using a variable output divisor is referred to hereafter as a "fractional-N" synthesizer since it synthesizes frequencies by apparently dividing by values of the output divisor N which are not whole numbers. As will be apparent, the output divisor N is variable around some base value, for example, the output divisor N can be varied between N and N+1 or N and N−1.

In operation, a fractional synthesizer varies the output divisor N between two or more integers, such as N and N+1, in a predetermined divisor sequence to approximate division with a non-integral output divisor. The fractional synthesizer may also compensate for any resulting post-division, fractional remainders. For example, suppose that in a certain fractional-N synthesizer design the output divisor N should optimally be equal to N+(⅓). As was stated, conventional non-fractional-N synthesizers only divide the output frequency $F_{vco}$ by integers. However, dividing by the output divisor N equal to N+(⅓) may be approximated by dividing by the integer sequence:

$$N=N, N, N+1, N, N, N+1, N, N, N+1$$

Accordingly, if the output frequency $F_{vco}$ is divided by the output integer N two times out of three and by the output integer N plus 1 one time out of three, the output frequency $F_{vco}$ will be divided, on average, by the output digital divisor N having a value of N+⅓. This type of fractional-N synthesizer, as described below, results in a periodic approximation error which is large and must be accurately compensated.

The approximation of a fractional part by varying the output divider N between N and N+1 according to some pattern gives rise to a periodic error in the oscillator control voltage which is termed "fractional ripple". In prior art fractional-N synthesizers, the periodic error is of such magnitude that steps must be taken to reduce it. A block diagram of a known technique described in U.S. Pat. No. 4,179,670 issued to Kingsbury for reducing the error is shown in FIG. 1B. Typically, this prior art technique equates the instantaneous digital value in the fractional-N accumulator 38 with the approximation error, and converts the digital value to an analog compensation signal using the D/A converter 40. The compensation signal must further be scaled down in proportion to the N value of the divider 22 before being subtracted from the phase comparator output at the ripple compensator 32. The Kingsbury patent discloses that the variable divider 22 has an output pulse mark space ratio proportional to 1/N and thus the desired scaling down by the factor N can be achieved by chopping the compensation signal from the D/A convertor 40 using a chopper switch 41 driven by the output pulses from the variable divider 22.

Despite these ingenuities of the prior art, fractional-N ripple compensation remains prone to analog circuit component tolerances, and thus a need exists to reduce the amount of ripple to be compensated or to otherwise devise simpler methods of compensation, which improvements may be obtained by practicing the present invention as described herein.

SUMMARY OF THE INVENTION

Using a novel fractional synthesis approach and arrangement, the present invention achieves fine frequency resolution with low phase noise while retaining a high phase comparison frequency/fast frequency changing speed using a single phase-lock synthesizer loop. Benefits of the invention also include low complexity and low cost.

In a first example embodiment of the present invention, a frequency synthesizer accurately generates an output signal of a desired frequency related to a reference phase comparison frequency signal by a non-integral factor. A reference frequency generator supplies a reference frequency signal. A first variable divider divides the reference frequency signal by a first predetermined divisor M and produces an output pulse for the reference phase comparison frequency signal after every M cycles of the reference frequency signal. A fractional controller varies the first predetermined divisor M between successive output pulses of the variable reference divider to produce a mean output pulse frequency having a non-integral relationship to the reference signal frequency. A voltage controlled oscillator produces the output signal frequency and is controlled by a control voltage signal. A second variable divider divides the output signal frequency by a second predetermined divisor N to produce an output pulse of a second phase comparison frequency signal after every N cycles of the output signal. A phase detector compares the reference phase comparison frequency signal with the second phase comparison frequency signal to produce an error signal. A signal processor processes the error signal to produce the control signal such that the output signal from the oscillator is controlled to the desired frequency.

The signal processor includes a low pass loop filter and a ripple compensator, the latter being used to compensate for variations of the first divisor M from a non-integral mean value. In a relatively simple implementation, the fractional-M controller varies the reference divisor M between preselected integer values in a predetermined pattern, e.g., M and M+1. An overflow accumulator is incremented when the reference divider produces an output pulse, and the predetermined pattern is determined by overflow of the accumulator.

In a second example embodiment of the present invention, a fractional controller varies the first and the second predetermined integers between a first pair of values (N1, M1) and a second pair of values (N2, M2). The pairs of values are selected so that a ratio of the first pair of values is a close fractional approximation less than a ratio of the desired frequency to the reference frequency, and the ratio of the second pair of values is a close fractional approximation greater than the ratio of the desired frequency to the reference frequency. Thus, the fractional controller varies the integers M and N between different pairs of preselected integer values in a predetermined pattern.

In a third example embodiment of the present invention, the fractional controller generates a loop gain compensation signal for controlling a gain of the error signal generated by the phase detector. This loop gain compensation signal minimizes the effect of varying N and/or M. The phase detector error signal is scaled based on a current value of M or N. For example, a larger value of M results in a larger scaling of the error signal.

In a fourth example embodiment, the phase detector is a charge pump type of phase detector that includes a pull-up current mirror and a pull-down current mirror for reflecting a current generated based on the compensation signal received from the fractional controller. A negative or positive pulse of current is generated depending upon a sign of the detected phase error. The width of the current pulse is based on the magnitude of the phase error while the magnitude of the current pulse is varied in proportion to a variation of M or N.

The present invention also provides various methods for synthesizing a range of frequencies generated by an electrically tuned oscillator. For a desired output frequency to be generated by the oscillator, a sequence of rational fractions is determined that equals a non-integral value in the mean. The reference oscillator frequency is divided by the sequence of denominator values of the rational fractions while the electrically tuned oscillator frequency is divided by the sequence of numerators of the rational fractions. The divided frequencies are compared to a phase error signal. From the error signal, a control signal is produced applied to the oscillator to generate the desired output frequency.

In accordance with the second example embodiment, a first and second pair of integer divisors are determined. The reference frequency and oscillator output frequency are divided by a sequence of the first and second pairs. Various procedures are set forth for determining the values of the first and second pairs of integer values for each desired output frequency and the sequence in which those integer pairs are used to reduce an accumulated/integrated phase error.

BRIEF DESCRIPTION OF THE DRAWINGS

The features and advantages of the present invention will be described in further detail below in conjunction with the drawings in which like reference numbers refer to similar elements throughout the drawings.

DETAILED DESCRIPTION OF INVENTION

Figure 1A:
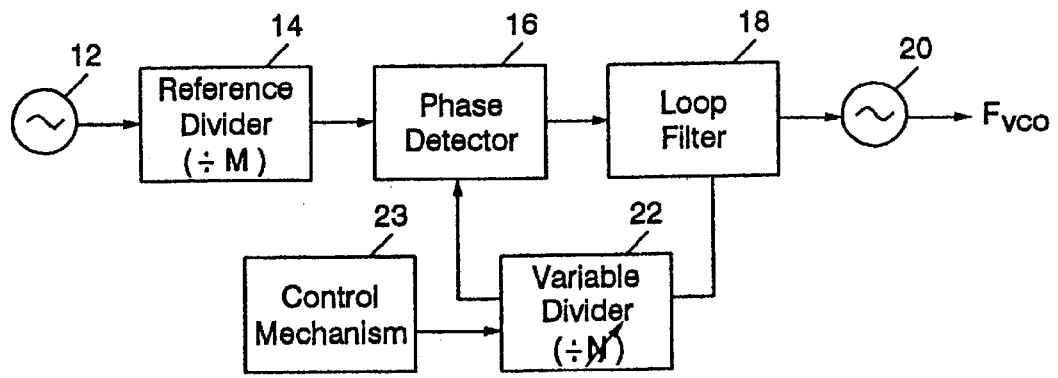
FIG. 1A is a functional block diagram of a known PLL digital frequency synthesizer.

In the following description, for purposes of explanation and not limitation, specific details are set forth, such as particular circuits, components, techniques, etc. in order to provide a thorough understanding of the present invention. However, it will be apparent to one skilled in the art that the present invention may be practiced in other embodiments that depart from these specific details. In other instances, detailed descriptions of well known methods, devices, and circuits are omitted so as not to obscure the description of the present invention with unnecessary detail.

Fractional-M Frequency Synthesis

In one exemplary embodiment of the present invention shown in FIG. 2, the frequency changing speed and the synthesizer settling time are decoupled from the fineness of frequency resolution by varying a reference divisor M. The reference divisor M is a variable integer divisor which is used to reduce the reference frequency $F_{ref}$ for comparison to an output frequency $F_{vco}$ during the time a single output frequency is being generated. A frequency synthesizer in accordance with the present invention that accomplishes this decoupling is referred to hereafter as a "fractional-M" synthesizer which synthesizes frequencies by varying the reference divider between integer values as opposed to varying the output divider. As described below, the fractional-M frequency synthesizer in accordance with this exemplary embodiment of the invention may employ a variable reference divisor M together with value of an output integer N that is fixed during production of a given frequency in order to approximate a fractional frequency ratio while compensating for approximation errors.

More specifically, the reference divisor M is varied between two or more integers with a "mark-space ratio" selected to approximate the desired fractional part. The various values of the reference divisor M include typically a base (reference) integer M and integers around the base integer M, such as M+1, M+2 or M−1. The value of the reference integer M may vary for different desired output frequencies $F_{vco}$, as may the output divisor N. To approximate division by a reference divisor M which has a fractional value, the reference divisor M is varied in accordance with a predetermined divisor sequence. To approximate the reference divisor M having a value equal to a selected base reference integer M plus a fraction of ⅓, for example, the reference divisor M is varied in accordance with the following reference divisor sequence:

$$M=M, M, M+1, M, M, M+1, M, M, M+1 \quad (1)$$

In this reference divisor sequence (1), every third value of the reference divisor M is M+1 instead of M. A more complicated reference divisor sequence involving M, M+1, and M−1 may be used in order to reduce any resulting approximation errors, i.e., dividing periodically by M−1 to offset the error in approximating division by (M+⅓) using M and M+1.

The reference divisor sequence (1) may be produced by using one or more registers, designated herein as an accumulator, to accumulate fractional remainders from each division until an accumulated sum equals or exceeds one. At that point, a variable reference divider 30 divides by M+1 for the next frequency cycle to correct for the accumulated remainders, or error. Any residual fractional remainder is carried forward in the accumulator, and the accumulator continues to accumulate unused fractional remainders for subsequent divisions until the accumulated sum again equals or exceeds one. In this way, overflow from the accumulator generates the required reference divisor sequence of values for the reference divisor M.

Figure 1B:
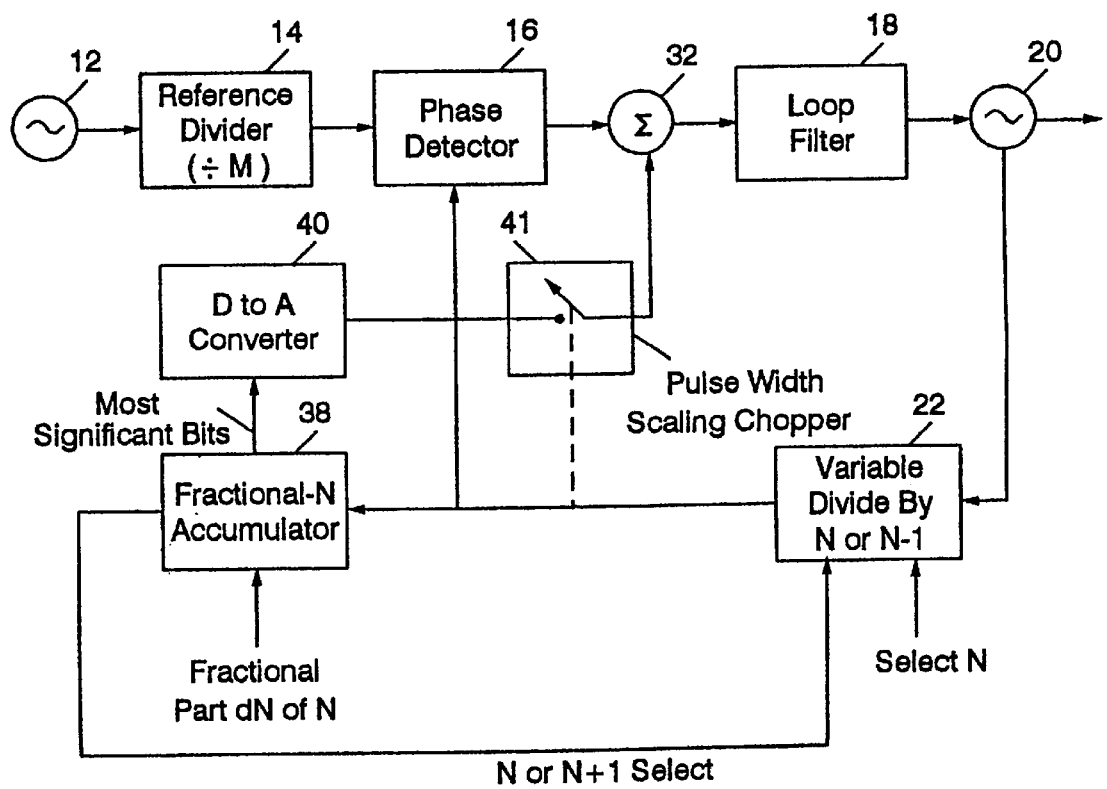
FIG. 1B is a block diagram of a prior art fractional-N synthesizer.

In known implementations, such as that shown in FIGS. 1A and 1B, the reference divisor M is fixed during a period in which the output frequency $F_{vco}$ is required to be constant. The present invention advantageously varies the value of the reference divisor M during this period. In a second example embodiment described below, both the reference divisor M used to reduce the reference frequency $F_{ref}$ and the output divisor N used to reduce the output frequency $F_{vco}$ may be varied during this period.

Figure 2A:
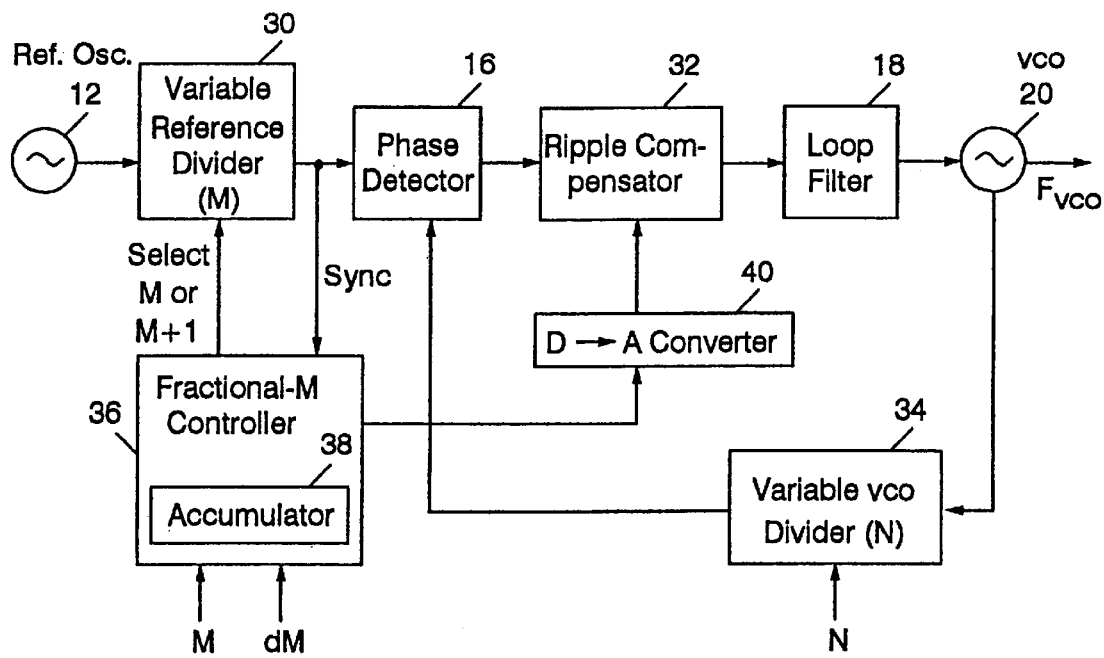
FIG. 2A is a function block diagram of a fractional-M digital frequency synthesizer in accordance with the present invention.

FIG. 2A illustrates a fractional-M frequency synthesizer in accordance with the present invention. Since many of the elements described previously with respect to FIG. 1A are duplicated in FIG. 2A, the following description focuses on the newly-added features or elements. The fractional-M synthesizer comprises the variable reference divider 30 and a programmable VCO divider 34. While not shown, the reference frequency $F_{ref}$ from the reference source 12 and/or the output frequency $F_{vco}$ from the VCO 20 may be prescaled (by a suitable prescaler) to reduce the required operating speed of the digital logic used to build either, or both, of the variable dividers 30 and 34. A suitable dual-modulus prescaler and further variable divider design techniques are disclosed in U.S. Pat. No. 5,066,927, entitled "Dual Modulus Counter For Use In A Phase Locked Loop" and issued to Dent, the disclosure of which is hereby incorporated by reference. Alternatively, the reference frequency $F_{ref}$ and/or the output frequency $F_{vco}$ may be converted using a heterodyne frequency converter or mixer to a different frequency (usually lower), if more suitable for the realization of the desired divider ratios.

The variable reference divider 30 closely approximates division by a non-integral value of the reference divisor M by using a reference divisor sequence of integers M and M+1. Of course, other more complicated divisor sequences of M-based integers may be used. Using the exemplary reference divisor sequence (1) set forth above, the variable reference divider 30 divides the reference frequency $F_{ref}$ by reference integers M or M+1 as controllably selected based on a control signal generated by a fractional-M controller 36. The variable reference divider 30 produces an output pulse in a reference pulse train after every M cycles of the reference frequency $F_{ref}$. The output pulse train generated by the variable reference divider 30 is compared by the phase detector 16 to an output pulse train from the VCO divider 22.

The fractional-M controller 36 accumulates, in an accumulator 38, fractional remainders dM from each division until the accumulated sum equals or exceeds some maximum value, or maximum count, $M_{max}$. The maximum value $M_{max}$ is called the "modulus" of the accumulator 38. When the accumulated sum equals or exceeds the modulus $M_{max}$, the accumulator sum is reset and a "carry" pulse is generated. In this example, the fractional remainder dM determines the number of times (on average) that the reference frequency $F_{ref}$ should be divided by the reference integer M before being divided by M+1. The reference divider 30, the controller 36 and the accumulator 38 comprise a reference divider circuit for dividing the reference frequency by the reference integer M, or reference divisor M. The values of the reference integer M and the fractional remainder dM are shown as inputs to the fractional-M controller 36 and are set taking account of such factors as the output frequency $F_{vco}$ of the VCO 20, the value of the output divisor N, and other possible factors described in later example embodiments.

When the accumulated sum equals or exceeds the modulus $M_{max}$, the accumulator 38 is reduced by a value equal to modulus $M_{max}$ and the variable reference divider 30 is instructed by the fractional-M controller 36 to divide by M+1 for the next divide cycle of the reference divider 30 to correct for accumulated error. Thereafter, the fractional-M controller 36 changes the value of the reference divisor M back to the reference integer M until instructed otherwise via the control signal. Any residual fractional remainder in the accumulator 38 after reduction modulo $M_{max}$ is carried forward in the accumulator 38 and the accumulator 38 continues to accumulate fractional remainders dM from subsequent division cycles until the accumulated value again equals or exceeds the modulus $M_{max}$. In this way, overflow from the accumulator 38 generates the required reference divisor sequence, such as the sequence (1), for the reference divisor M.

For example, a modulo-Q accumulator, where Q is an integer, may be used to generate the desired reference divisor sequence. The modulo-Q accumulator stores the fractional remainder dM. Based on whether the modulo-Q accumulator overflows, or underflows, on a last accumulation cycle, a value for the reference divisor M (which could vary between the reference integer M and the reference integer plus one M+1) is selected. The modulo-Q accumulator may be incremented, or decremented, on each count cycle by a selected integer X amount. The value of "Q" may be determined in accordance with the following equation:

$$Q = F_{vco}/C$$

where C is a common factor, or preferably the highest common factor, of the output frequency $F_{vco}$ and the reference frequency $F_{ref}$.

The approximation of fractional values for the reference divisor M by varying the integer divider between different values, e.g., M and M+1, according to a particular divisor sequence, or pattern, results in a periodic error in the output error signal to the VCO 20, referred to hereafter as "fractional ripple". The cumulative fractional remainder stored at any one time in the accumulator 38 represents the instantaneous fractional ripple error.

The fractional ripple error may be visualized as a sawtooth waveform that ramps up to a peak value as the accumulator 38 counts up to the modulus $M_{max}$. When the accumulator 38 reaches the modulus $M_{max}$, the value in the accumulator 38 is reduced by the modulus $M_{max}$. To subtract out the instantaneous fractional ripple error of the loop, a ripple circuit 37 generates a digital ripple compensation signal which is representative of the current accumulated value stored in the accumulator 38. A digital-to-analog (D/A) converter 40 converts the digital ripple compensation signal into an analog ripple compensation signal. The analog ripple compensation signal representing the fractional ripple error is then subtracted from, or added to (as necessary), the phase error signal generated by the phase detector 16 in a ripple compensator 32. The loop filter 18, the ripple compensator 32, the D/A converter 40 and the controller 36 or 42 comprise a signal processor. The phase detector 16 and the signal processor in combination comprise an output processing circuit.

In a general embodiment of the fractional-M synthesizer according to the invention, a sequence of division ratios $M_1$, $M_2$ ... $M_i$ together with the number of times $A_i$ each division ratio is used in a repeating cycle is determined to satisfy the equation:

$$\frac{A_1 * M_1 + A_2 * M_2 \ldots + A_i * M_i}{N * (A_1 + A_2 + \ldots + A_i)} = \frac{F_{ref}}{F_{vco}}$$

where $M_1$, $M_2$ ... $M_i$ represent i different values for the reference divisor M used by the reference divider during production of the output frequency $F_{vco}$ and $A_1$, $A_2$ ... $A_i$ represent a corresponding number of times that each value of the reference divisor M is used in one cycle of the predetermined pattern. Since many solutions exist, the invention comprises selecting that solution which minimizes fractional ripple error.

To illustrate the operation of this exemplary embodiment, the ratio of the output frequency $F_{vco}$ and the reference frequency $F_{ref}$ may be expressed in a prior art manner as:

$$F_{vco}/F_{ref} = (N+dN)/M_o \qquad (2)$$

where the reference integer $M_o$ is a fixed integer to be divided into the reference frequency $F_{ref}$, the output integer N is the integral portion of the variable output divisor N and dN is the fractional portion of the variable output divisor N to be realized by prior fractional-N techniques. According to the present invention, the reciprocal ratio $F_{ref}/F_{vco}$ may be expressed as:

$$F_{ref}/F_{vco} = (M+dM)/N_o \qquad (3)$$

where the output integer $N_o$ is an integer, the reference integer M is the integer portion of the reference divisor M and the fractional remainder dM is the fractional portion of the reference divisor M realized using fractional-M techniques.

Equating equations (2) and (3) results in the following equation:

$$M+dM = N_o * M_o/(N+dN)$$

Now suppose that the fractional-N synthesizer was to have synthesized a fraction dN given by n/d, where n is the numerator of the fraction and d is the denominator of the fraction. For example, if the denominator d equals 10, then the fractional-N synthesizer would have synthesized VCO output frequencies of $\{N, N+\frac{1}{10}, N+\frac{2}{10}, N+\frac{3}{10} \ldots\}$ times the phase comparison frequency $F_{ref}/M_o$. Substituting dN=n/d in the above equation and rearranging so that the resulting denominator is an integer results in the equation:

$$M+dM = No * Mo * d/(N*d+n)$$

Thus, the reference integer M is the whole part and dM is the remainder of $(N_o * M_o * d)$ divided by $(N*d+n)$. The remainder dM has the form $r/(N*d+n)$ showing that it is a rational fraction with a denominator equal to $(N*d+n)$. Thus the required fractional-M value dM that is to be produced by fractional-M controller 36 has a denominator of $(N*d+n)$, which is the required modulus of the accumulator 38.

Figure 2B:
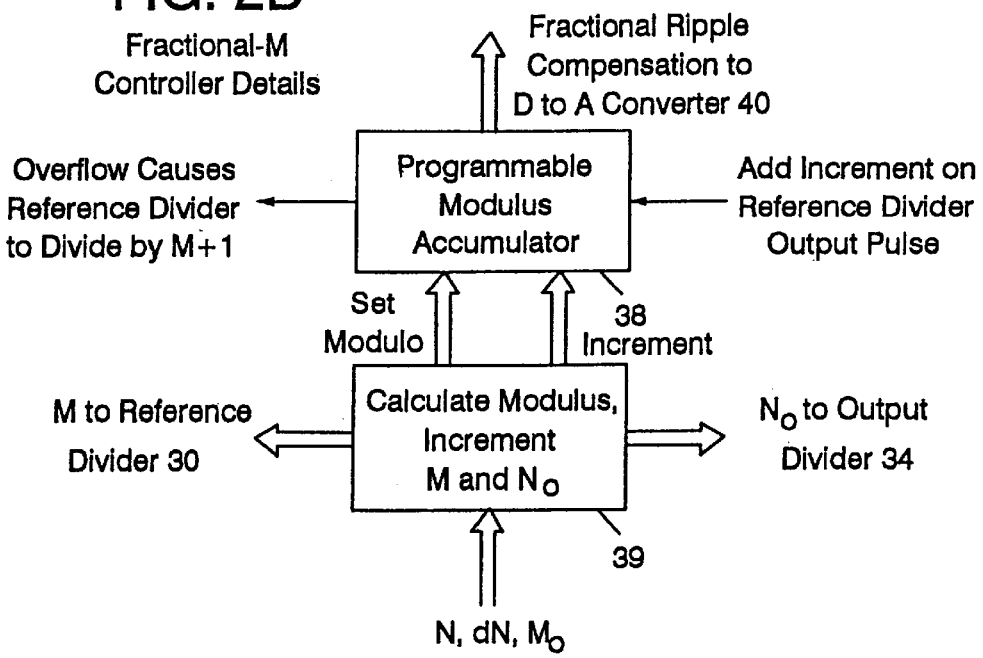
FIG. 2B is a block diagram of a fractional-M controller which may be used in the fractional-M frequency synthesizer shown in FIG. 2A.

Further details of the fractional-M controller are shown in FIG. 2B. A calculator 39 receives an indication of the desired frequency, which may be in terms of the parameters N, dN=n/d and $M_o$ that would be used in a prior art fractional-N synthesizer. The calculator 39 computes the required accumulator modulus $(N*d+n)$ and the remainder r upon division of $N_o * M_o * d$ by this modulus, where $N_o$ is the value of the output divider to be used for the fractional-M synthesizer One method for selecting a value of $N_o$ that the calculator 39 may be programmed to implement is to select a value of $N_o$ so that the computed value of M is always the same. An alternative criterion may be to select a value of $N_o$ nearest to the value of $N_o$ which results in a constant computed value of M which is an easily obtained division ration, such as a multiple of 64 or other prescaler value. The fractional-M synthesizer can thus be used to simplify the high-speed output divider 34 such as by eliminating the need for a multi-modulus prescaler, or by using a higher prescaler division ratio that cannot provide certain values of $N_o$.

The calculator 39 can thus be programmed to computer fractional-M parameters while avoiding the values of $N_o$ that cannot be reached. The calculator 39 computers the fractional-m modulus for the accumulator 38 from the parameters N, d, and n that would normally be used to program a prior art fractional-N synthesizer, while the increment to the accumulator 38 is computed as the remained upon dividing $N_o*M_o*d$ by this modulus. The base value M for the reference divider 30 is computed as the whole part obtained when $N_o*M_o*d$ is divided by the accumulator modulus.

In cases where the reference integer M is greater than the output integer N, such as when the output frequency $F_{vco}$ is mixed down to a lower frequency before being input to the VCO divider 22, or where the reference frequency $F_{ref}$ is higher than the output frequency $F_{vco}$, the fractional ripple is advantageously reduced since the ratio of N/M is less than 1. There is also an advantage in making the fractional ripple a function of the reference source 12 rather than the VCO 20. If the magnitude of the fractional ripple is dependent upon the value of the output divisor N, the ripple compensation signal provided to the ripple compensator 41 must be accurately scaled for each different selected output frequency $F_{vco}$. Such scaling requires extra multiplication and determination of many different scaling factors. However, in this example embodiment of the present invention, the magnitude of the fractional ripple is based on the reference divisor M. Because the reference frequency $F_{ref}$ is fixed, the fractional ripple is independent of the output divisor N and the output frequency $F_{vco}$. Therefore, scaling of the ripple compensation signal to correct the fractional ripple is not needed.

The modulus $N*d+n$ of the accumulator 38 is the lowest integer value of the output divisor N that produces a desired output frequency $F_{vco}$ using conventional non-fractional synthesis as in FIG. 1A. Assume as an example that the desired output frequency $F_{vco}$ is 1000.1 MHz and the reference frequency $F_{ref}$ is 10 MHz. The reference integer M is selected on the order of 10 to give a phase comparison rate (as well as channel spacing/frequency resolution) in the 1 MHz range, i.e., 10 MHz/10=1 MHz. A value for the output integer N and a reference divisor sequence containing "m1" divide-by-10's, (i.e., divide by M=10), and "m2" divide-by-11's, (i.e., divide by M+1=11) are determined which result in a mean output frequency corresponding to the desired output frequency $F_{vco}$ of 1000.1 MHz. The equation therefore to be satisfied and solved is:

$$\frac{F_{ref}}{(10*m1)+(11+m2)} = \frac{F_{vco}}{(m1+m2)*N} \quad (4)$$

Thus, the sum (m1+m2) equals the total number of integer divisions required to approximate one cycle of the fractional-M division. Since the desired output frequency $F_{vco}$ is just over 1000 times the 1 MHz phase comparison rate/frequency resolution, a suitable choice for the output integer N is the next highest integer, or N=1001. With M=10 and N=1001, the solution of the equation (4) is m1=9911, m2=90, and (m1+m2)=10001. Accordingly, the reference frequency $F_{ref}$ is divided 90 times by 11 for every 9911 times the reference frequency $F_{ref}$ is divided by 10. The 90 instances of divide-by-11 are preferably distributed among the 9911 instances of divide-by-10 as evenly as possible throughout the total 10001 division cycles. Such a pattern may be produced by the overflow events of a modulo-10001 accumulator repeatedly incremented by 90. Thus, in the novel fractional-M synthesizer in accordance with the present invention, the value of the output integer N that would be needed in a non-fractional synthesizer is determined and used to program the modulus $M_{max}$ of the fractional-M accumulator 38. In the above example, the output integer N equals 10001 with a corresponding 0.1 MHz phase comparison frequency.

It may be practically inconvenient to use an accumulator whose modulus varies according to the desired output frequency $F_{vco}$. A constant modulus equal to a power of two (binary) is typically easier to implement because it facilitates generation of a ripple compensation signal of constant magnitude using a digital-to-analog converter driven directly by the most significant fractional accumulator bits. Use of a binary-modulus accumulator results in an approximation to the desired output frequency, the accuracy of which can be as high as necessary by using sufficiently long word length.

For example, if in the above example a 16-bit binary accumulator were used (modulo-65536 instead of modulo-10001), the increment to the accumulator which most nearly yields the desired frequency is 649, and the resulting frequency error is −305 Hz. Irrespective of which particular accumulator modulus is used, accumulator increments may be computed in real time by the fractional-M controller 36 for each new desired output frequency, or computed in advance for each possible output frequency, stored in a look-up table and later retrieved by the fractional-M controller 36.

In the above example, the choice of the output integer N=1001 was somewhat arbitrary. If the reference divisor M has the values M=10 and M+1=11, the output integer N may be chosen anywhere in the range of 1000<N≦1100 with different resulting error patterns, some of which may be more desirable than others. For each desired output frequency $F_{vco}$, a value of the output integer N is chosen within this range based on desired characteristics of the fractional ripple pattern, e.g. minimum low frequency spectral energy. Some inventive methods for selecting values, or sequences of values, for both the reference integer M and the output integer N will now be described.

Fractional N and M Frequency Synthesis

Figure 3:
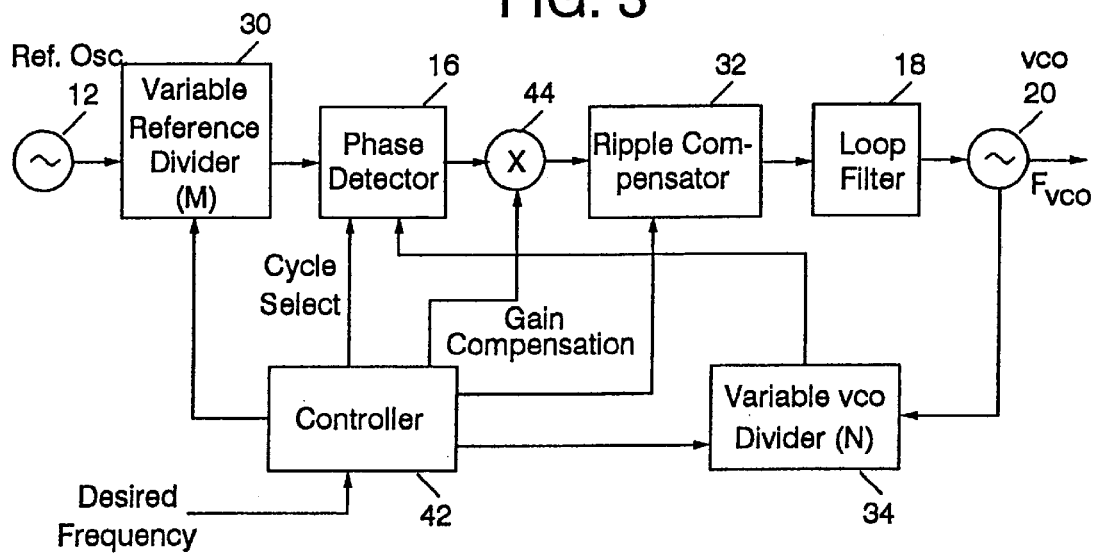
FIG. 3 is a functional block diagram of a sequential fraction approximation synthesizer according to the present invention in which both N and M are varied during production of a single output frequency.

Another exemplary embodiment of the present invention is shown in FIG. 3. Under the control of a controller 42, the variable reference divider 30 divides the reference frequency $F_{ref}$ by a reference divisor sequence of values for the reference divisor M. The controller 42 sends the values of the reference divisor M to reference divider 30 from the controller 42. For example, a reference divisor sequence of values for the reference divisor M comprised of M and M+1 may be generated to produce a "mean", non-integer divisor between M and M+1 as described in the above embodiment.

Moreover, the controller 42 also generates an output divisor sequence of values for the variable output divisor N which is provided to the VCO divider 34 to produce a mean, non-integer divisor. The controller 42 may be implemented using any suitable electronic circuitry including for example, a programmed microprocessor, a digital signal processor, an application specific integrated circuit (ASIC), and the like. The values of the reference integer M and the output integer N are selected by the controller 42 based on the selected desired output frequency $F_{vco}$, such as the frequency of a recently assigned RF working channel, which is an input to the controller 42.

The principle of the second exemplary embodiment is described herein for the example case where only two pairs of divisor values are used. These pairs of divisor values are first output and reference integers N1, M1 and second output and reference integers N2, M2. Values for the output and reference integers N1, M1, N2, M2 may be determined within certain bounds to satisfy the following:

$$F_{vco}(\text{below}) = (N1/M1) * F_{ref} \quad (5)$$

and $$F_{vco}(\text{above}) = (N2/M2) * F_{ref} \quad (6)$$

The values of the first and second integer pairs (N1, M1) and (N2, M2) are preferably determined so that a below frequency $F_{vco}$(below) and an above frequency $F_{vco}$(above) are equal to the desired output frequency $F_{vco}$. However, if this cannot be accomplished, the integer pairs should be determined so that the below and above frequencies $F_{vco}$(below) and $F_{vco}$(above) are respectively as close as possible below (using N1, M1) and above (using N2, M2) the desired output frequency $F_{vco}$. In this way, when the selected values of the first output and reference integers N1, M1 are used, the phase error at the phase detector 16 develops a progressive lag as slowly as possible. Similarly, when the selected values of the second output and reference integers N2, M2 are used, the phase error develops a progressive advance as slowly as possible.

By alternating between the first integer pair N1, M1 and the second integer pair N2, M2, the accumulation of phase error may be substantially minimized. Various algorithms may therefore be devised to minimize the cumulative phase error (or sometimes even more advantageously the integral of the cumulative phase error) thereby resulting in a fractional ripple considerably smaller than in a purely fractional-N frequency synthesizer. As mentioned above, the goal of such an algorithm is to determine values for the reference and output integers M and N that best approximate a frequency just below (for the first integer pair N1, M1) and just above (for the second integer pair N2, M2) the desired output frequency $F_{vco}$.

Table 1 gives an example of values for the first and second integer pairs (N1, M1) and (N2, M2) calculated in accordance with an algorithm described below for synthesizing a series of 25 KHz spaced channels (i.e., the frequency resolution) starting at an output frequency of 1000 MHz using a reference frequency of 13 MHz with a design constraint that phase comparisons should be performed at least every 200 KHz so that the reference integer M should be no greater than 65 (13 MHz/200 KHz=65).

TABLE 1

| Entry | CHANNEL (MHz) | N1 | M1 | ERROR (KHz) | N2 | M2 | ERROR (KHz) |
|---|---|---|---|---|---|---|---|
| 1 | 1000.000 | 1000 | 13 | 0 | 1000 | 13 | 0 |
| 2 | 1000.025 | 3077 | 40 | 0 | 3077 | 40 | 0 |
| 3 | 1000.050 | 3154 | 41 | −1.2 | 4231 | 55 | +4.6 |
| 4 | 1000.075 | 1077 | 14 | −3.6 | 6385 | 57 | +12 |
| 5 | 1000.100 | 3308 | 43 | −7.0 | 2231 | 29 | +3.5 |
| 6 | 1000.125 | 4539 | 59 | −6.3 | 1154 | 15 | +8.4 |
| 7 | 1000.150 | 4963 | 61 | −2.5 | 3539 | 46 | +2.1 |

Consider Entry 3 wherein the desired output frequency $F_{vco}$, or channel, is 1000.050 MHz with the reference frequency $F_{ref}$ at 13 MHz. Using equation (5), when the first output integer N1 is 3154 and the first reference integer M1 is 41, we obtain:

$$F_{vco}(\text{below}) = (3154 * 13 \text{ MHz})/41 = 1000.0488 \text{ MHz}$$

which is just below the desired output frequency $F_{vco}$ of 1000.050 MHz, or an error of −1.2 KHz. When the second output integer N2 equals 4231 and the second reference integer M2 is 55, we obtain a value for the above frequency $F_{vco}$(above) of 1000.0545 MHz, or an error of +4.5 KHz, using equation (6):

$$F_{vco}(\text{above}) = (4231 * 13 \text{ MHz})/55 = 1000.0545 \text{ MHz}$$

The solution then is to choose a sequence of the first and second integer pairs N1, M1 and N2, M2 that generates a mean between the two determined "close" above and below frequencies to approximate the desired output frequency $F_{vco}$ of 1000.050 MHz. One solution is a sequence consisting of dividing by the first integer pair N1, M1 three times and the second integer pair N2, M2 one time, then repeating the four pair sequence.

In Table 1, the values for both the output integer N and the reference integer M in the integer pairs (N1, M1) and (N2, M2) may be multiplied by a factor if the determined value of the output integer N is too low to be practical, as long as the determined value of the reference integer M remains below a desired maximum. This may be necessary when the variable output divider 22 incorporates a variable-ratio, high-speed prescaler that sets limits on the lower values of the output integer N that can be programmed.

The approximate magnitudes of the errors listed in Table 1 (all less than 13 KHz) are significantly smaller than the 175 KHz peak error of a fractional-N synthesizer design in which only the output divisor N is varied. This error reduction of more than an order of magnitude may, in some cases, permit ripple compensation mechanisms to be dispensed with, particularly when the sequence of the integer pairs (N1, M1) and (N2, M2) is optimized to spectrally disperse the ripple error.

Figure 4:
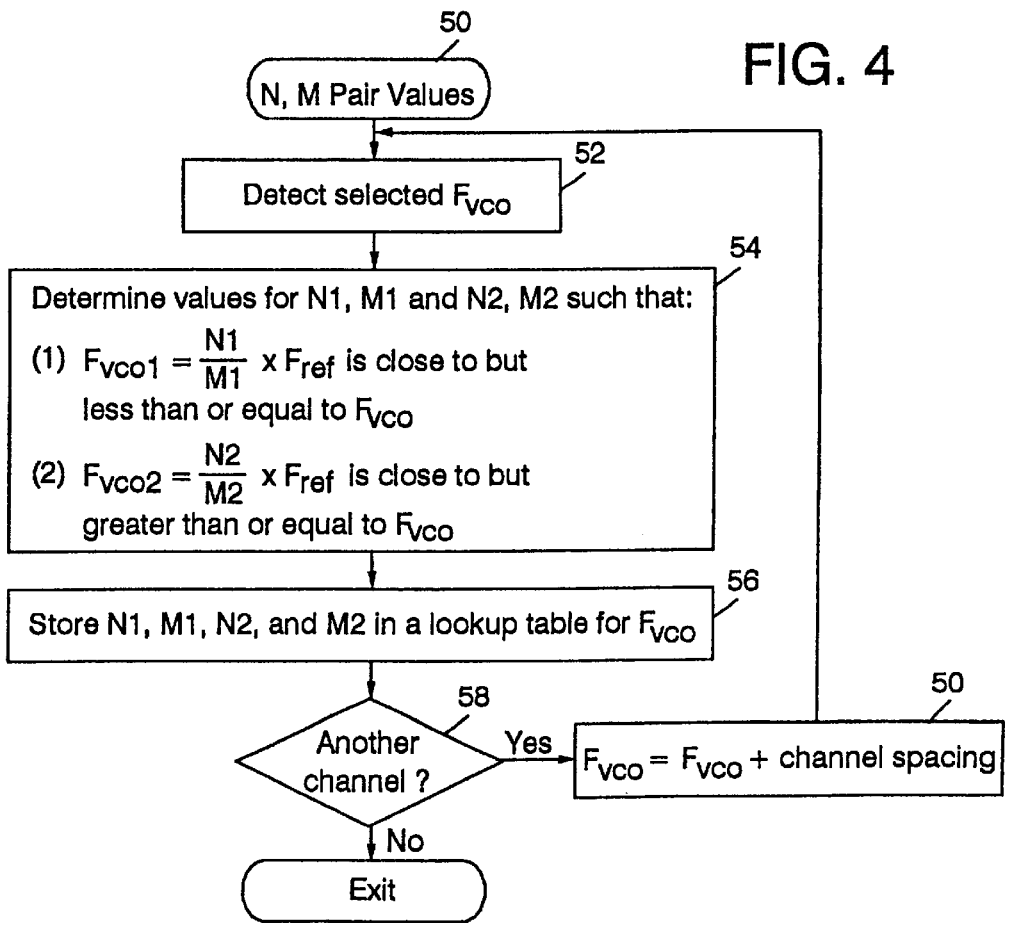
FIG. 4 is a flowchart showing example procedures for selecting optimal values for a reference divisor M and an output divisor N which may be implemented in the synthesizer shown in FIG. 3 in accordance with the present invention.

FIG. 4 is a flowchart outlining general but nonetheless example procedures which may be implemented by the controller 42 to determine optimum values for the integer pairs (N1, M1) and (N2, M2). Routine 50 may be used by computational circuitry for example to generate a look-up table similar to Table 1 described above. In block 52, the selected frequency channel $F_{vco}$ for which optimal values for the integer pairs (N1, M1) and (N2, M2) are to be determined is detected. The values of the integer pairs (N1, M1) and (N2, M2) are then determined by the using the above equations (5) and (6).

The calculations of the values of integer pairs (N1, M1) and (N2, M2) are accomplished m in block 54. Of course, if either of the values for the below and above frequencies $F_{vco}$(below) and $F_{vco}$(above) are equal to the desired output frequency $F_{vco}$, the corresponding values of the reference and output integers M and N are used as in a non-fractional synthesizer in that their values are constant for that particular output frequency $F_{vco}$ or channel.

The values of the integer pairs (N1, M1) and (N2, M2) determined in block 54 are stored in a look-up table for the particular selected output frequency $F_{vco}$ in block 56. A decision is made in block 58 whether another frequency channel is to be analyzed. If so, the previous output frequency (or channel) $F_{vco}$ is incremented to the next channel frequency in block 60 and control returns to the block 52.

Thus, the general technique includes varying the reference and output divisors (N, M) between two pairs of associated, predetermined values of the integer pairs (N1, M1) and (N2, M2) determined by solving equations (5) and (6). The values of the integer pairs (N1, M1) and (N2, M2) that result in the below and above frequencies $F_{vco}$(below) and $F_{vco}$(above) closest to the desired output frequency $F_{vco}$ are stored in the look-up table. Determining an optimum sequence/pattern comprised of the values of the integer pairs ($N_1$, M1) and (N2, M2) is referred to as "sequential fraction approximation" and the method of determining the sequences is further discussed below.

If the entries in Table 1 are extended, the approximated errors remain relatively small up to a selected output frequency $F_{vco}$ of around 1000.800 MHz The immediately following channels, however, are numerically more difficult to approximate by integers within the specified range. This difficulty is limited to a range of channels and it is eventually possible to continue the table with low approximation errors. Such regions of difficulty are associated with restrictions placed on allowable values of the output and reference integers N and M. These restrictions are typically design restrictions based on circuit parameters and the like. By relaxing these design restrictions, the difficulty in approximating the values of the integers (N, M) can be made less troublesome as described below.

A strategy for selecting values for the integer pairs (N, M) for a particular division cycle may be based on minimizing the integral of accumulated phase error or of minimizing the instantaneous value of the phase error as in the above method. An advantage of minimizing "integrated phase error" is that the low-frequency spectral content of the fractional ripple is reduced. Minimizing integrated phase error generally requires that the number of integer pairs (N, M) used not be restricted to the two pairs determined using the FIG. 4 procedure. In a further generalization of the sequential fraction approximation technique, therefore, there is no restriction on the number of different values of the integer pairs (N, M) that can be invoked during the synthesis of a particular frequency. In general, a different pair of integers, not restricted to only two pairs, can be selected for each division cycle.

The following restrictions on the acceptable values of the integers (N, M) may apply in certain practical implementations, however:

(a) the reference integer M should be less than some specified maximum, i.e., phase comparisons should take place with at least a minimum frequency; and (b) a minimum value of the output integer N may be set, so that the divider 34 may more easily be constructed to operate at high speeds with the aid of a prescaler.

An alternative view of the function of the dividers 30 and 36 in terms of their "selecting cycles" for comparison will now be outlined as an aid to understanding the invention. When the output frequency $F_{vco}$ is divided by the output divisor N having a value equal to the output integer N, cycles of the output frequency $F_{vco}$ are effectively being counted, i.e., cycle 1, cycle 2, cycle 3, ... cycle N, at which point the cycle count repeats itself. However, the variable VCO divider 34 only transmits one output pulse to the phase detector 16 when the cycle count reaches the output integer $N_o$ In effect, programming the VCO divider 34 to divide by the output integer N for this division is equivalent to ignoring the intervening cycles 1, 2, 3, ... N–1 and selecting the cycle which is N cycles in the future for performing the next phase comparison with a reference cycle. Likewise, in the variable reference divider 30 when the reference divisor M equals the reference integer M, cycles 1, 2, 3, ... M–1 of the reference frequency $F_{ref}$ are effectively ignored as there is an output pulse only after M cycles. Thus, the reference divider 30 effectively selects a reference cycle which is M cycles in the future to compare with a VCO output cycle which is N cycles in the future.

Therefore, selecting values for the integers N and M is effectively selecting a reference cycle M ahead and an output cycle N ahead for phase comparison in the phase detector 16. Phase comparison is equivalent to measuring the time difference between the positive going (from negative to positive) zero crossings of the Mth reference cycle and the Nth output cycle. If the zero crossings do not exactly coincide, there is a positive or negative phase error depending upon which zero crossing firs occurred. When viewed in this framework, a cycle selection feature of the present invention endeavors to determine which future zero crossings of the reference frequency $F_{ref}$ and of the output frequency $F_{vco}$ most closely coincide within a selected maximum time limit, thereby determining the values of M and N to use for the current divide cycle.

Figure 5:
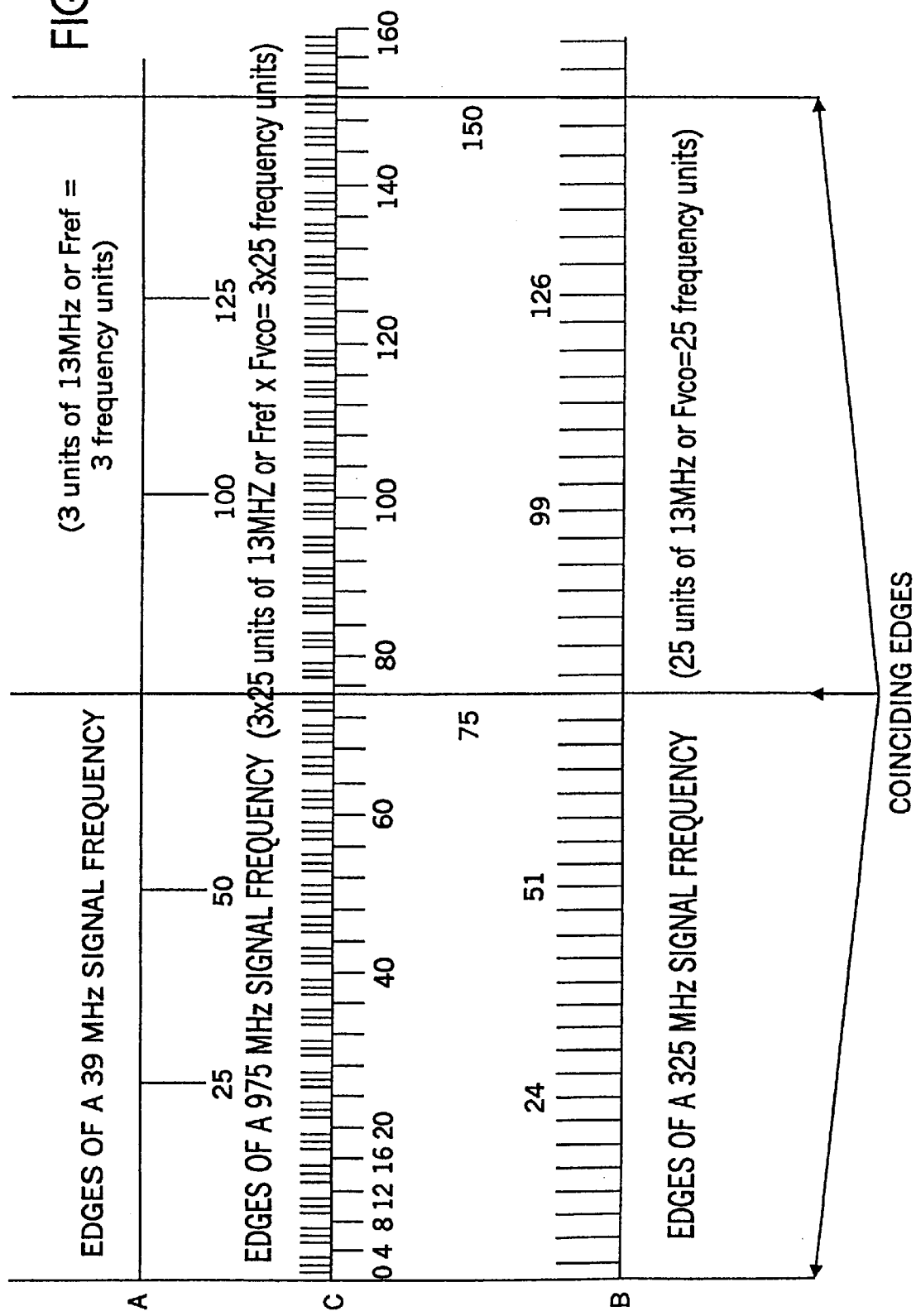
FIG. 5 is an illustration of a highest common period concept used in a cycle selection embodiment in accordance with the invention.

FIG. 5 illustrates the concept of a highest common subperiod between two signals having different frequencies, such as the reference frequency $F_{ref}$ and the output frequency $F_{vco}$. In the example shown in FIG. 5, pulses (or edges of pulses) of the reference frequency $F_{ref}$ are set equal to 39 MHz (shown at line A) and pulses of the output frequency $F_{vco}$ are set equal to 325 MHz (shown at line B). The highest common factor between 39 MHz and 325 MHz is 13 MHz, i.e., 39 MHz=3×13 MHz and 325 MHz=25×13 MHz As the highest common factor, 13 MHz is established as the "frequency unit". Accordingly, the reference frequency $F_{ref}$ is 3 frequency units and the output frequency $F_{vco}$ is 25 frequency units. As should be noted, dividing 39 and 325 by the common factor of 13 results in mutually prime numbers (3 and 25). Mutually prime numbers, as is known, have no common factor.

The product of the reference and output frequencies $F_{ref}$ and $F_{vco}$ (in frequency units) is 3×25, or 75 frequency units, corresponding in hertz to 975 MHz. The edges of such a 975 MHz signal are shown at line C in FIG. 5. As shown, the edges/pulses numbered 0, 75, 150 . . . etc. of the 975 MHz signal coincide with the edges/pulses of both the reference frequency $F_{ref}$ (line A) and the output frequency $F_{vco}$ (line B). Accordingly, 975 MHz is the lowest frequency common multiple of both the reference and output frequencies $F_{ref}$ and $F_{vco}$. The cycle period of the 975 MHz signal is thus the "highest common subperiod" of the reference and output frequencies $F_{ref}$ and $F_{vco}$. An edge of the reference frequency $F_{ref}$ and an edge of the output frequency $F_{vco}$ therefore coincide at a regular interval which is an integer multiple of this highest common subperiod. These zero crossing coincidences are the preferred edges upon which to perform a phase comparison since, at these coincidences, the expected timing error is zero.

Unfortunately, such zero crossing coincidences at an integer multiple of the highest common subperiod may not occur frequently enough. In the example shown in FIG. 5, the numbers have been chosen to illustrate zero crossing coincidences at a conveniently visible number of common subperiods. However, if the desired output frequency $F_{vco}$ was not 325 MHz but was 324.95 MHz, the lines A, B and C would have to be significantly longer to illustrate just two consecutive zero crossing coincidences. Such prolonged periods between phase comparisons are typically unsatisfactory.

In the example shown in FIG. 5, it might be desired to perform phase comparisons at the more frequent intervals of reference signal zero crossings occurring at 0, 25, 50, 75, 100, 125 and 150 common subperiods, of which only those at 0, 75 and 150 are "ideal" positions that exactly coincide with a zero crossing of the VCO output frequency. The cycles of the VCO output frequency most closely coinciding with the "non-ideal" phase comparisons at 25, 50, 100 and 125 common subperiods have zero crossings at 24, 51, 99 and 126 common subperiods respectively, which are respectively one subperiod early, one subperiod late, one subperiod early and one subperiod late relative to the reference signal zero crossings at 25, 50, 100 and 125 subperiods. The expected timing error sequence starting at zero is thus 0, +1, −1, 0, +1, −1, 0 . . . , where a+1 indicates that the edge of the output frequency $F_{vco}$ occurs one common subperiod earlier than the compared edge of the reference frequency $F_{ref}$ and a −1 indicates that the edge of the output frequency $F_{vco}$ occurs one common subperiod later than the compared edge of the reference frequency $F_{ref}$.

The illustration in FIG. 5 shows that the expected timing errors for phase comparisons between the output and reference frequencies $F_{vco}$ and $F_{ref}$ may be expressed as an integer multiple of the highest common subperiod as defined above. Integers may therefore be used to keep track of the expected timing error, the cumulative error, or any other error criterion, such as time-weighted error depending upon the particular pair of reference and output frequency $F_{ref}$ and $F_{vco}$ edges compared.

Consequently, look-ahead logic using integer arithmetic may be implemented to evaluate the error criterion for future phase comparisons and to choose the edges to be compared at a future comparison in order to optimize the error criterion. Once the expected timing error for a particular comparison is determined, the difference between the expected timing error and the measured timing error becomes the actual timing error between the reference and output frequencies $F_{ref}$ and $F_{vco}$. By predicting the expected timing error and subtracting the expected timing error from the measured timing error, the above described fractional ripple caused by comparing non-coincidental edges can be reduced substantially.

More generally, the reference and output frequencies $F_{ref}$ and $F_{vco}$ expressed in units of their highest common factor are factors of their common multiple frequency $(F_{vco}*F_{ref})$ and should both cross zero simultaneously every $(F_{vco}*F_{ref})$ cycles. Any difference between their respective zero crossings at other times is expected to be a predictable, integral multiple of periods of their common multiple frequency $(F_{vco}*F_{ref})$. Phase comparisons may be performed by the phase detector 16 between a zero crossing of the reference frequency $F_{ref}$ and either the nearest preceding cycle or the nearest succeeding cycle of the output frequency $F_{vco}$. The resulting phase, or timing, error differs in the two cases of a preceding or succeeding cycle by the number of periods of the common multiple frequency $(F_{vco}*F_{ref})$ in a single cycle of the reference frequency $F_{ref}$. It is therefore possible to select cycles for comparison in order to obtain either a positive or a negative error. It is similarly possible to make phase comparisons between a zero crossing of the reference frequency $F_{ref}$ and any cycle of the output frequency $F_{vco}$. The timing errors, or time displacements, for such phase comparisons will differ by multiples of frequency units of the reference frequency $F_{ref}$ dependent upon which cycles of the output frequency $F_{vco}$ are selected. It is therefore possible to select cycles for comparison in order to have larger error than the minimum error, if this is advantageous in order to quickly compensate for a large cumulative error of the opposite sign.

Figure 6:
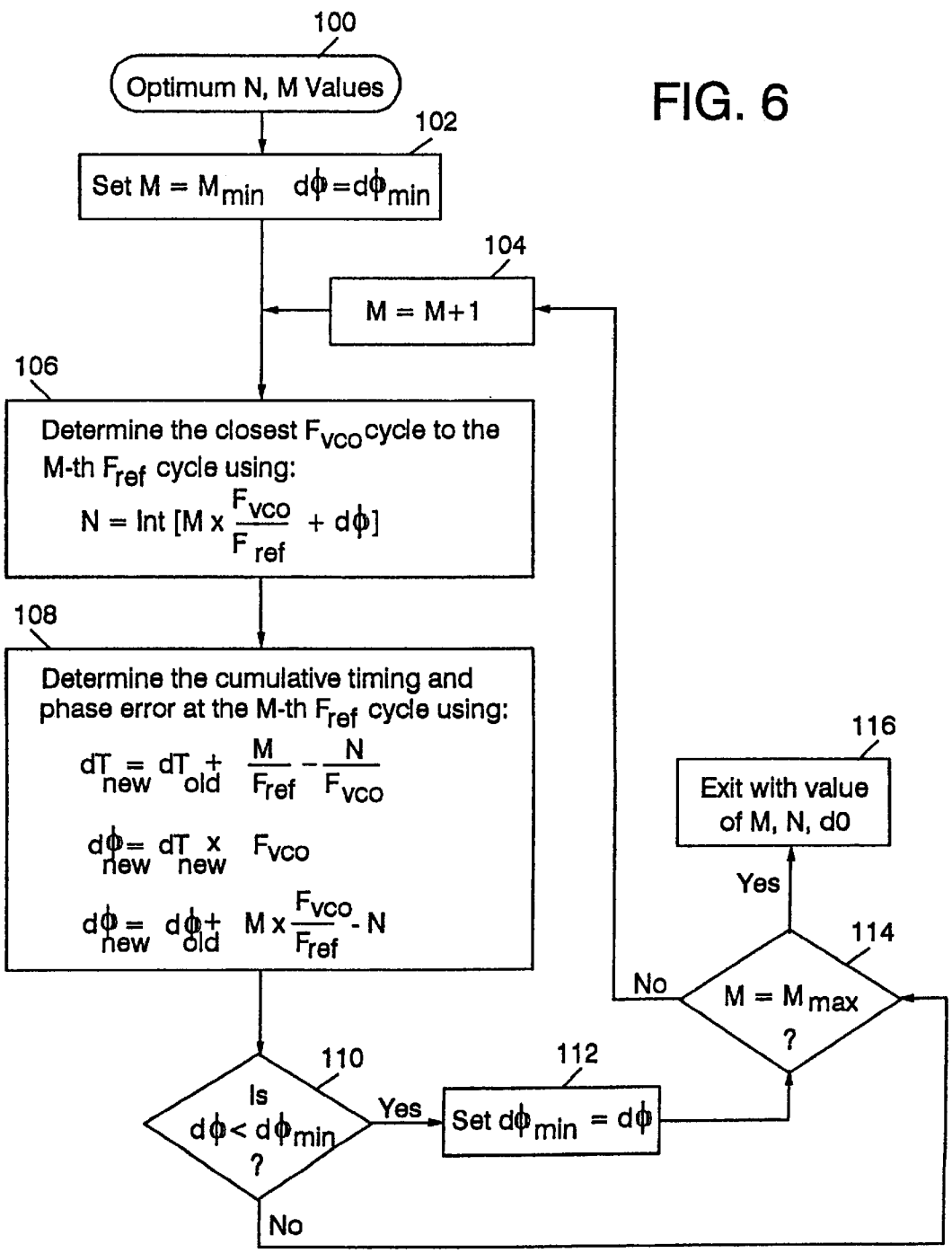
FIGS. 6–8 are flowcharts showing various example procedures for selecting values for integer pairs (M, N) in accordance with another exemplary embodiment of the invention.

A flowchart shown in FIG. 6 sets forth an Optimum N, M Values routine 100 for determining which cycle of the reference frequency $F_{ref}$ to use in the future, thus determining the optimum values of the integers M and N to use in any particular count cycle. The cumulative, or integrated, phase error, denoted by $d\phi$, is to be minimized by choosing a cycle of the reference frequency $F_{ref}$ to compare with a cycle of the output frequency $F_{vco}$ located N cycles in the future.

Preferably, the chosen cycle of the reference frequency $F_{ref}$ is located between a minimum value $M_{min}$ of cycles and a maximum value $M_{max}$ of cycles in the future.

Integrated phase error is preferably minimized rather than simply minimizing phase error. As is known, integrating the phase error emphasizes minimizing low frequency components of the phase error and de-emphasizes minimizing high frequency components of the phase error. The high frequency components can be de-emphasized since the loop filter 18 removes the high frequency components of the phase error. Stated differently, minimizing the integral of the phase error "pushes" the frequency spectrum of the phase error away from lower frequencies towards higher frequencies, where the loop filter 18 can more easily attenuate it.

Minimizing the low frequency components more heavily than the high frequency components of the phase error may also be accomplished by giving preference to overcorrection of phase errors, or integrated phase errors. More specifically, overcorrection of a phase error results in a new phase error having a different sign than the phase error which was overcorrected. Having alternating residual error signs (+, −, +, −, . . . ) tends to reduce undesirable low frequency error components more effectively than a sequence of declining errors of the same sign.

Returning to FIG. 6, the value of the reference integer M is set at block 102 to a minimum value $M_{min}$ and the integrated phase error $d\phi$ is equal to the minimum value found on the previous equation. The Nth cycle of the output frequency $F_{vco}$ closest to the Mth cycle of the reference frequency $F_{ref}$ is determined at block 106 in accordance with the following equation:

$$N = INT(M*F_{vco}/F_{ref}+d\phi) \tag{7}$$

where INT is the "integral part of" the result of the calculation contained in the parenthesis. A new cumulative timing error $dT_{new}$ and a new cumulative phase error $d\phi_{new}$ between the Mth cycle of the reference frequency $F_{ref}$ and the closest Nth cycle of the output frequency $F_{vco}$ is determined in block 108 using the following equations:

$$dT_{new} = dT_{old}+(M/F_{ref})-(N/F_{vco}) \tag{8}$$

$$d\phi_{new} = dT_{new}*F_{vco} \tag{9}$$

that is, $$d\phi_{new} = d\phi_{old}+M*(F_{vco}/F_{ref})=N \tag{10}$$

where $dT_{old}$ is a previous timing error and $d\phi_{old}$ is a previous phase error. The equations (7) through (10) set forth in blocks 106 and 108 are employed to calculate new cumulative values of the phase error $d\phi$ for each possible choice of the output and reference integers N and M.

A decision is made in block 110 whether the new cumulative phase error $d\phi_{new}$ is less than the minimum phase error $d\phi_{min}$. If the new cumulative phase error $d\phi_{new}$ calculated in block 108 is less than the previously found minimum phase error $d\phi_{min}$, the minimum phase error $d\phi_{min}$ is reset to this new value of the phase error $d\phi_{new}$ at block 112. A decision is made in block 114 whether the maximum value $M_{max}$ of the reference integer M has been attained. If the maximum value $M_{max}$ has not been attained, the value of the reference integer M is incremented in block 104 and the procedures in blocks 106 through 114 are repeated.

However, if the maximum value $M_{max}$ has been reached, the best values of the reference and output integers M and N and the corresponding value of the minimum phase error $d\phi_{min}$ are recorded at block 118. The process of FIG. 6 may be executed in real time by suitable digital signal processing. Alternatively, the process may be executed during design or manufacture of the apparatus and the sequence of the N, M values obtained may be permanently stored in memory in the apparatus for recall. A sequence has to be stored for each of the output frequencies $F_{vco}$ the apparatus may be called upon to synthesize, and the sequences must of course be of a reasonable finite length in order to avoid an excessive memory size. Typical sequences that result from the process of FIG. 6 are given in tables 2 and 3. A feature of the sequences is always that the ratio of the sum of the N values to the sum of the M values is exactly equal to the ratio of $F_{vco}$ to $F_{ref}$.

Returning to the block 106, a closest future cycle pulse (or edge) of the output frequency $F_{vco}$ to be compared with a future cycle pulse (or edge) of the reference frequency $F_{ref}$ is determined using equation (7) wherein INT means "integral part of." The goal is to find the Nth cycle of the output frequency $F_{vco}$ that occurs closest in time to the Mth cycle of the reference frequency $F_{ref}$ occurring after the previous phase comparison. The last cycle of the output frequency $F_{vco}$ is assumed to have occurred just before the current Mth cycle of the reference frequency $F_{ref}$ by an amount of time dT. Therefore, the Nth cycle of the output frequency $F_{vco}$ will occur at a time $N/F_{vco}$ seconds later, or at a time $N/F_{vco}-dT$ relative to the last cycle of the reference frequency $F_{ref}$ where a comparison was made. The next cycle of the reference frequency $F_{ref}$ will occur at a time $M/F_{ref}$ seconds later which hopefully is as close as possible to the Nth cycle of the output frequency $F_{vco}$.

The maximum and minimum values $M_{max}$ and $M_{min}$ of the reference integer M are preferably set to ensure that phase comparisons are made with at least a minimum frequency, i.e., not too far into the future. Setting minimum values for the reference integer M is desirable since high frequency digital dividers are sometimes difficult to construct with low division ratios. As is known, special high frequency prescalers are oftentimes required to obtain low division ratios, however, such prescalers unfortunately impose a minimum division limit. While the reference divider 30 in FIG. 3 need not be of this type, the variable output divider 34 is preferably of the type that imposes a minimum division limit, i.e. a minimum value of the output integer $N_o$. Therefore, selecting a small value for the reference integer M necessitates a correspondingly small value for the output integer $N_o$. Consequently, a minimum limit is placed on the value of the reference integer M so that the corresponding value of the output integer N is not too low.

An example of a sequence produced by the above described cycle selection is tabulated below in Table 2 for the case where the reference frequency $F_{ref}$ is 520 times the channel spacing, the desired output frequency $F_{vco}$ is 40013 times the channel spacing, and the value of the reference integer M must be less than 65 ($M_{max}<65$).

TABLE 2

| Phase Error Integral | Phase Error | M | N |
|---|---|---|---|
| 1 | −2 | 19 | 1462 |
| 5 | 4 | 58 | 4463 |
| 2 | −3 | 19 | 1462 |
| 5 | 3 | 58 | 4463 |
| 1 | −4 | 19 | 1462 |
| 3 | 2 | 58 | 4463 |
| −2 | −5 | 19 | 1462 |

TABLE 2-continued

| Phase Error Integral | Phase Error | M | N |
|---|---|---|---|
| −1 | 1 | 58 | 4463 |
| 6 | 7 | 58 | 4463 |
| −1 | −7 | 38 | 2924 |
| −2 | −1 | 58 | 4463 |
| 3 | 5 | 58 | 4463 |
| TOTALS | | 520 | 40013 |

As Table 2 shows, the first phase comparison after an arbitrary starting point in the sequence is performed after 19 cycles of the reference frequency $F_{ref}$ and 1462 cycles of the output frequency $F_{vco}$ have been completed. The next phase comparison is made after 58 cycles of the reference frequency $F_{ref}$ and 4463 cycles of the output frequency $F_{vco}$, and so on. The leftmost column lists the integral of the phase error before each new phase comparison and the adjacent column lists instantaneous phase error at each new comparison. The units of phase error are $1/520$ths of a cycle of the output frequency $F_{vco}$. As shown, the peak value of the instantaneous phase error is $7/520$ths of a cycle of the output frequency $F_{vco}$ (7 is the maximum instantaneous phase error in Table 2) which compares quite favorably with a determined peak value of $+/-\frac{1}{2}$ a cycle of the output frequency $F_{vco}$ for a fractional-N technique—an improvement, in this case, of 31 decibels.

A less numerically favorable example is shown in Table 3. But the improvement in peak phase error over a prior fractional-N technique is still almost an order of magnitude. Due to the pseudo-random nature of the error pattern, specific spectral components may be reduced by a greater factor.

TABLE 3

| Phase Error Integral | Phase Error | M | N |
|---|---|---|---|
| 30 | 33 | 1 | 77 |
| −2 | −32 | 65 | 5004 |
| 1 | 3 | 5 | 384 |
| 11 | 10 | 1 | 77 |
| 28 | 17 | 1 | 77 |
| −20 | −48 | 65 | 5004 |
| 2 | 22 | 10 | 770 |
| 31 | 29 | 1 | 77 |
| −5 | −36 | 65 | 5004 |
| 1 | 6 | 6 | 462 |
| 14 | 13 | 1 | 77 |
| 34 | 20 | 1 | 77 |
| −11 | −45 | 65 | 5004 |
| 0 | 11 | 8 | 616 |
| 18 | 18 | 1 | 77 |
| −29 | −47 | 65 | 5004 |
| 1 | 30 | 11 | 847 |
| −34 | −35 | 65 | 5004 |
| 1 | 35 | 10 | 770 |
| −29 | −30 | 65 | 5004 |
| −3 | 26 | 8 | 616 |
| TOTALS | | 520 | 40033 |

In the digital frequency synthesizer in the example shown in Table 3, the values of the output and reference integers N and M are both permitted to vary on successive division cycles between any number of pairs of values. The number of pairs of values may be constrained for practical or implementation reasons. These pairs of values may be designed to minimize the resulting periodic, systematic phase error of the VCO output signal with respect to an ideal phase slope for the desired output frequency $F_{vco}$. Alternatively, the pairs of values for the output and reference integers N, M may be designed to best achieve some performance criteria that can be applied to the phase error spectrum, the phase error waveform, or the time derivative or integral of the phase error. In one example, the reference and output integers M and N are chosen on successive division cycles during production of a desired frequency in a sequence predetermined to minimize the fractional ripple error.

Figure 7:
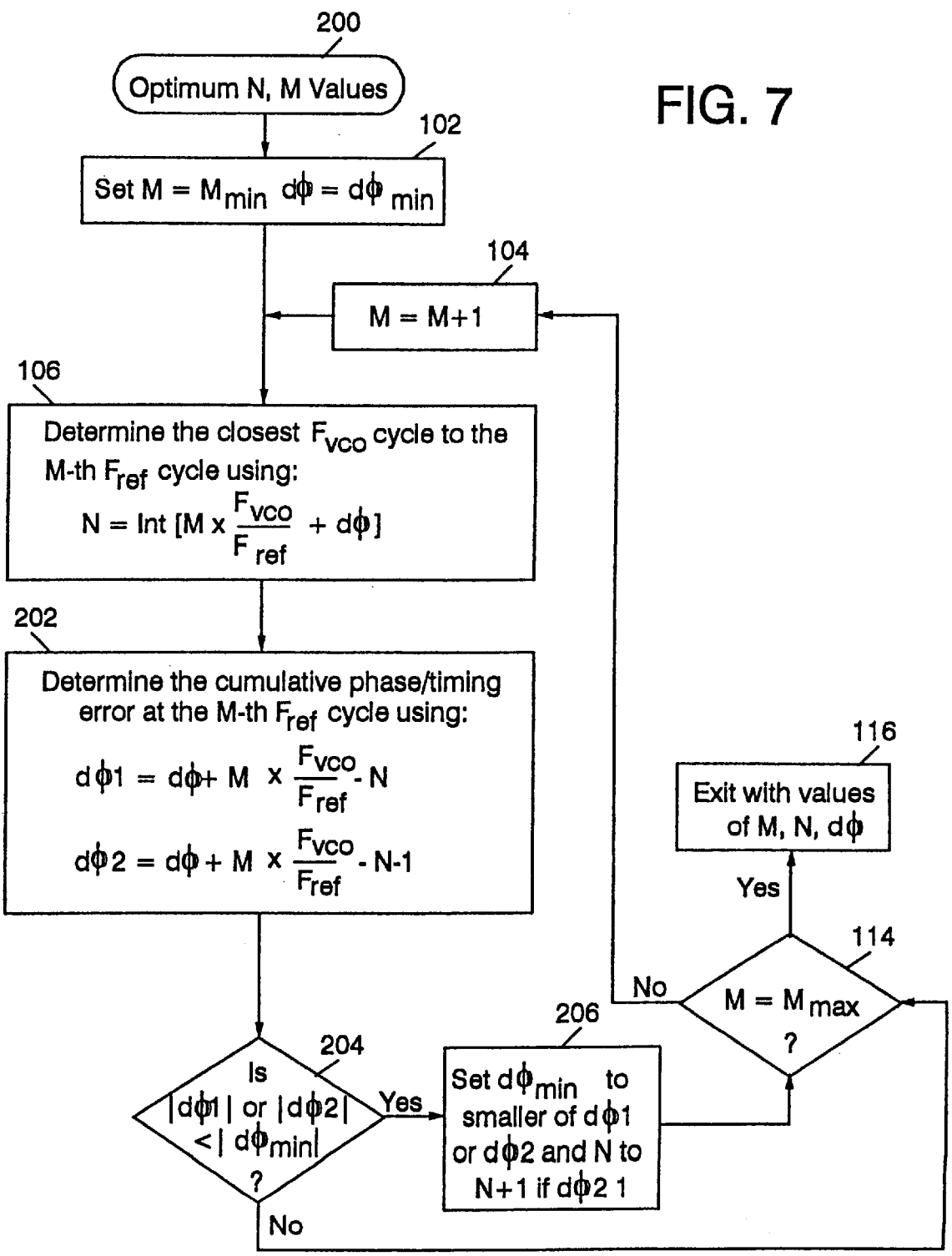

Routine 200 shown in FIG. 7 is similar to the routine 100 in FIG. 6 with like reference numerals referring to like procedures. In routine 100, the value of the output integer N computed in block 106 is set to always be below the value $(M*F_{ref}/F_{vco})$, so that the residual cumulative time and phase errors dT and dφ are always positive. However, as mentioned above, alternating signs of the phase error is preferable for reducing low frequency components of the phase error. Therefore, in block 202, an analysis is made whether an error of smaller magnitude but opposite sign would result from using the output integer plus one N+1 rather than the output integer N. At block 204, a decision is made whether a first phase error dφ1 associated with the reference and output integers M and N or a second phase error dφ2 associated with the reference integer M and the output integer plus one N+1 generates a lower cumulative phase error than the minimum cumulative phase error $d\phi_{min}$. The first and second phase errors dφ1 and dφ2 are determined using the following equations:

$$d\phi 1 = d\phi + (M*Fvco/Fref) - N \quad (11)$$

$$d\phi 2 = d\phi + (M*Fvco/Fref) - (N+1) \quad (12)$$

If either the first or second phase error dφ1 or dφ2 results in less cumulative phase error, the values for the corresponding integer pair (M, N) or (M, N+1) are saved together with their corresponding phase error dφ value -first or second phase error dφ1 or dφ2. As discussed above, it may be preferable to choose either the output integer N or the output integer plus one N+1 so that the next value of the cumulative phase error is inverted in sign compared to the previous cumulative phase error. Therefore, if the previous cumulative or integrated phase error value was positive, a value of the output integer N on the high side would be chosen. Alternatively, if the previous cumulative or integrated phase error was negative, a value of the output integer N on the low side would be chosen. Forcing the sign of the cumulative phase error dφ to alternate in this way results in an error with more high frequency energy and less low frequency energy, the high frequency energy being more readily filtered out in the loop filter 18. Extending this principle, it may be preferable to even select a larger error of opposite sign to compensate for a number of smaller previous errors of the same sign.

Loop, Gain Control

A practical consequence of varying the output and reference integers N and M over a large range is that the total loop gain also varies which unfortunately can adversely affect the dynamic characteristics, such as stability, of the feedback loop. Thus in a third exemplary embodiment of the invention, the controller 42 controls the gain of the phase comparator 16 in dependence on the currently selected value of M (or N) in order to maintain approximately constant loop gain.

Referring to FIG. 3, the controller 42 scales the phase error signal proportionally to either the value of the output integer N or the value of the reference integer M, suitably truncated and/or rounded to a practically convenient number of digits. The resultant scaling factor is converted into a proportional analog gain compensation signal by the controller 42. The gain compensation signal is then multiplied with the phase error signal using an analog multiplier circuit 44 to generate a compensated phase error signal. Alternatively, the gain compensation signal may drive a programmable attenuator through which the phase error signal passes. A more practically convenient method using a charge pump phase comparator will be described later with the aid of FIG. 9.

When there is a large difference between the minimum value $M_{min}$ and the maximum value $M_{max}$ of the reference integer M, the loop gain may change substantially depending upon the exact value of the reference integer M chosen in accordance with the procedures illustrated in FIGS. 6 and 7. Because variations in the loop gain may impair loop stability, it is desirable to maintain a constant loop gain. In accordance with an example embodiment of the invention, the output of the phase detector 16 is scaled in proportion to the value of the output integer N, or alternatively, in proportion to the value of the reference integer M, to keep the loop gain constant. When a larger value of the reference integer M is selected so that the next phase comparison is a longer time away, a larger error correction signal should be applied to the VCO 20 through the loop filter 18. When a smaller value of the reference integer M is chosen so that the next phase comparison occurs sooner, a smaller error correction signal should be generated. This keeps the amount of loop correction generated relatively constant per unit time.

In determining which values of the reference and output integers M and N to use, any change in the cumulative error accumulated in the loop filter 18 as a result of the above scaling is therefore taken into account. For large values of the reference integer M, the gain of the compensated phase error signal increases in proportion to the value of the reference integer M by an extra factor equal to the value of the reference integer $M_{max}$. This extra factor of the reference integer M appears in the equations (13) and (14) bleow and in FIG. 8, at block 302.

Figure 8:
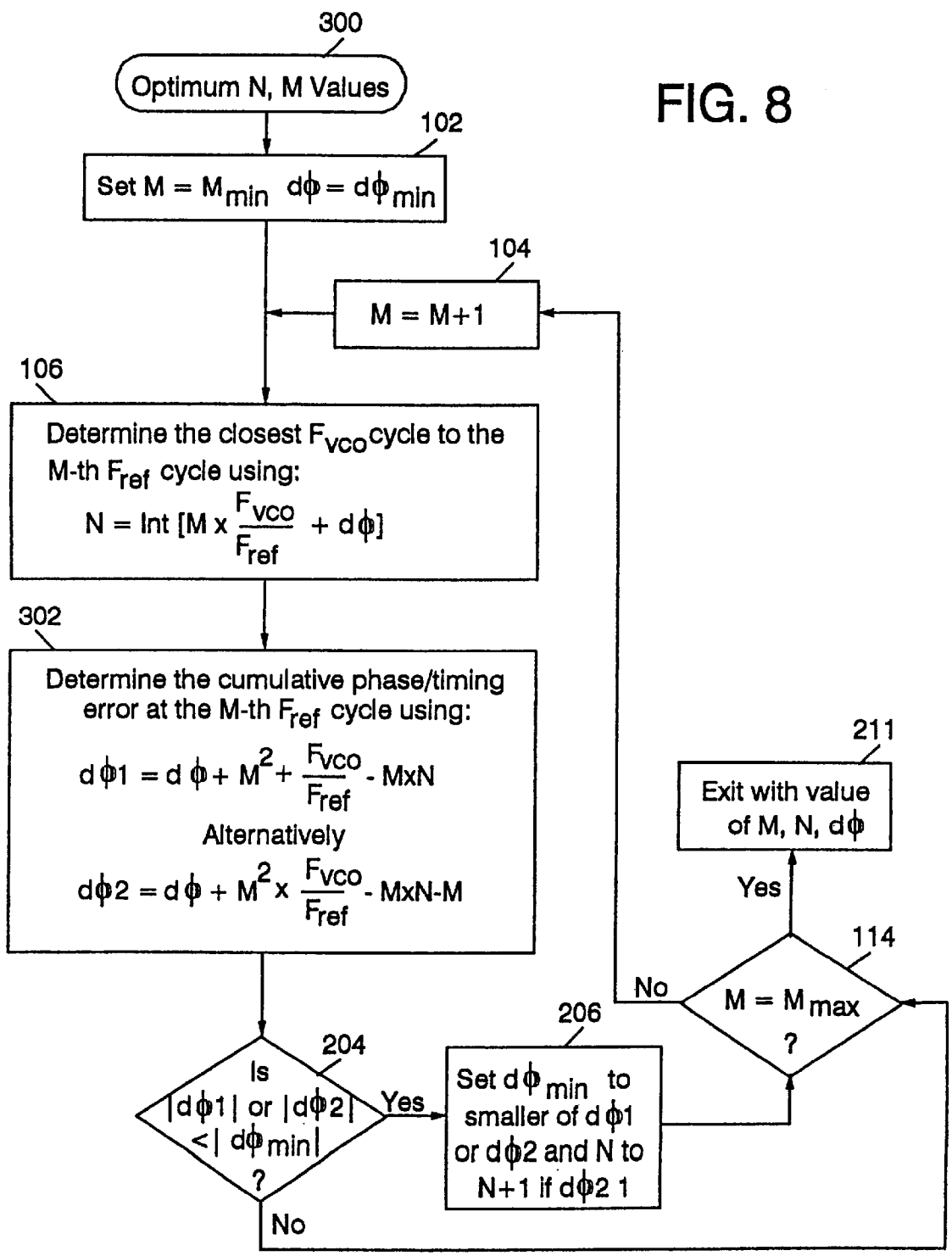

Accordingly, in routine 300 shown in FIG. 8, the cumulative phase error of the Mth cycle of the reference frequency $F_{ref}$ is determined in block 302 using the following equations:

$$d\phi 1 = d\phi + M^{2*}(Fvco/Fref) - (M*N) \quad (13)$$

$$d\phi 2 = d\phi + M^{2*}(Fvco/Fref) - (M*(N1)) \quad (14)$$

In this loop gain control embodiment, the optimum sequence of integer pairs (M, N) is optimized taking into account the weighting of the phase error from each phase comparison in proportion to the time elapsed since the previous phase comparison. An example of such a sequence is shown below in Table 4. The sequence is calculated for a reference frequency $F_{ref}$ equal to 520 frequency units and an output frequency $F_{vco}$ equal to 40013 frequency units (as in Table 2). The phase error detected at each phase comparison is weighted by the reference integer M before adding each weighted phase error to the integrated phase error total. To compress the table, an additional column has been added showing the number of consecutive cycles on which each integer pair (M, N) is used before moving on to the next pair.

TABLE 4

| Phase Error Integral | Phase Error | M | N | Number of times |
|---|---|---|---|---|
| 116 | 79 | 1 | 77 | 1 |
| −28 | −9 | 16 | 1231 | 1 |
| 107 | 72 | 1 | 77 | 3 |
| −58 | −3 | 55 | 4232 | 1 |
| 95 | 78 | 1 | 77 | 3 |
| −65 | −10 | 16 | 1231 | 1 |
| 23 | 44 | 2 | 154 | 1 |
| 94 | 71 | 1 | 77 | 1 |
| −126 | −4 | 55 | 4232 | 1 |
| −10 | 2 | 58 | 4463 | 1 |
| 19 | 29 | 1 | 77 | 1 |
| −71 | −5 | 18 | 1385 | 1 |
| −13 | 1 | 58 | 4463 | 1 |
| 70 | 55 | 1 | 77 | 2 |
| −32 | −6 | 17 | 1308 | 1 |
| −11 | 21 | 1 | 77 | 1 |
| −11 | 0 | 57 | 4386 | 1 |
| 70 | 54 | 1 | 77 | 2 |
| −49 | −7 | 17 | 1308 | 1 |
| 18 | 47 | 1 | 77 | 2 |
| −38 | −1 | 56 | 4309 | 1 |
| 41 | 53 | 1 | 77 | 2 |
| −95 | −8 | 17 | 1308 | 1 |
| −3 | 46 | 2 | 154 | 1 |
| 70 | 73 | 1 | 77 | 1 |
| −40 | −2 | 55 | 4232 | 1 |
| 37 | 52 | 1 | 77 | 2 |
| TOTALS | | | 520 | 40013 |

In Table 4, the accumulated phase error is weighted by the value of the reference integer M in accordance with equations (13) and (14). For comparison purposes, a fractional-N approach having a fixed reference integer M equal to 65 has a peak phase error integral of +/−½ cycle of the output frequency $F_{vco}$, or +/−260 period units. Therefore, such a conventional fractional-N approach results in a peak integral phase error of 65*260 subperiod units. This peak integral phase error is of course larger than the worst case integral phase error of 126 subperiod units shown in Table 4, where the loop gain compensation embodiment of the invention is employed. An improvement of more than two orders of magnitude, or 42 decibels, is thus achieved. Specific, individual spectral components may be reduced by an even greater factor. As a result of weighting the phase error resulting from sooner comparisons lower than the phase error of later comparisons, the loop-gain compensated method tends to result in more sooner comparisons, i.e. more frequent comparisons.

As a further demonstration of the advantages of using loop gain compensation in accordance with the invention, the example shown in Table 3 is reworked with loop gain compensation and the results are tabulated in Table 5 below. In Table 3, the peak error integral without loop gain compensation is 34*65=2210 period units which is an improvement of 18 a dB over a fractional-N technique using a fixed reference integer $M_{max}$ By adding loop gain compensation, the peak phase error integral becomes 260 period units, an improvement of 36 dB over the 65*260=16,900 frequency units for prior fractional-N techniques.

Loop gain compensation thus further reduces the fractional ripple error in otherwise numerically less fortunate cases. From Table 5, it may be observed that the repetition period of the sequence is 8 times longer than the comparison period (M=520) of a non-fractional N synthesizer. As those skilled in the art will readily comprehend, having a repetition period longer than the comparison period may result in subharmonics of the channel spacing frequency being present in the fractional ripple. Since those skilled in the art will be readily able to develop Table 5 and since a complete Table 5 would consist of a very large number of entries, most of the Table 5 entries have been omitted. In practice, having such a long table length may favor calculating a divisor sequence of values for the integers N, M in real time rather than using a look-up table. If desired, the divisor sequence of values for the integers N, M can be constrained to repeat within no greater a period than a conventional synthesizer would with little penalty in performance.

TABLE 5

| Phase Error Integral | Phase Error | M | N | Number of times |
|---|---|---|---|---|
| 210 | 54 | 1 | 77 | 5 |
| −249 | −459 | 1 | 76 | 1 |
| −3 | 82 | 3 | 232 | 1 |
| 86 | 89 | 1 | 77 | 1 |
| −158 | −4 | 61 | 4696 | 1 |
| −3 | 31 | 5 | 385 | 1 |
| 191 | 59 | 1 | 77 | 4 |
| −199 | −6 | 65 | 5004 | 1 |
| 17 | 36 | 6 | 462 | 1 |
| 231 | 64 | 1 | 77 | 4 |
| 166 | −1 | 65 | 5004 | 1 |
| 232 | 27 | 1 | 77 | 4 |
| −254 | −486 | 1 | 76 | 1 |
| −6 | 62 | 4 | 309 | 1 |
| 63 | 69 | 1 | 77 | 1 |
| −129 | −3 | 64 | 4927 | 1 |
| ... | ... | ... | ... | ... |
| −9 | 12 | 2 | 154 | 1 |
| 10 | 19 | 1 | 77 | 1 |
| TOTAL | | | 4160 | 320264 |

Other possible constraints which may be applied during construction of the divisor sequences include restriction on both the maximum and minimum values of the reference integer M and constraints on the allowable values of the output integer N below some minimum which are typically of concern when the variable divider is implemented using variable-ratio prescalers.

Charge Pump Phase Detector

Figure 9:
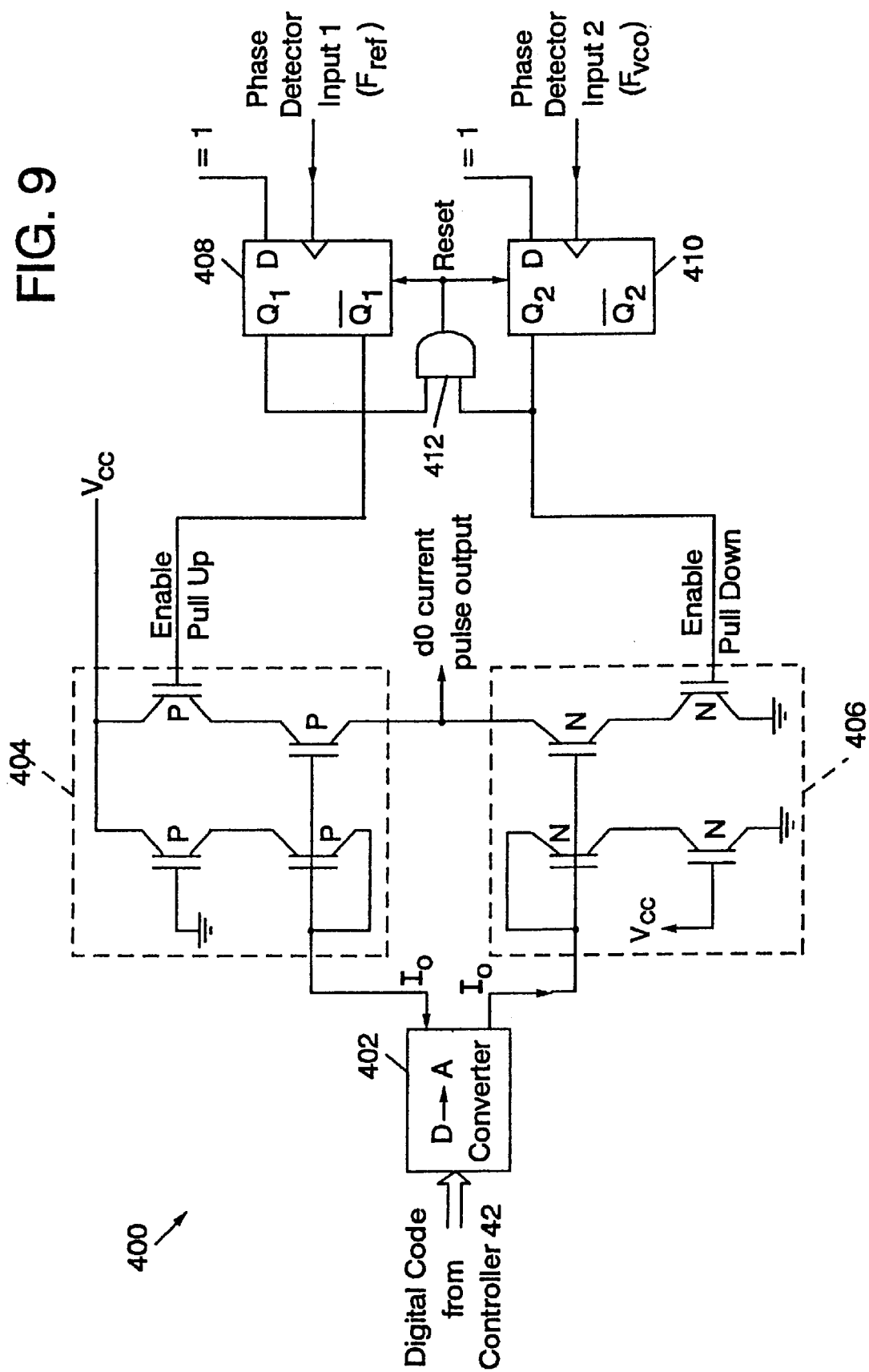
FIG. 9 is a diagram showing an exemplary implementation of a phase detector that may be used in a fractional digital frequency synthesizer in accordance with the present invention.

A specific method for weighting the phase error signal generated by the phase detector 16 in accordance with the loop gain control embodiment of the present invention is illustrated in FIG. 9 in a form suitable for realization as part of an integrated circuit chip. A charge pump phase detector 400 is a programmable phase detector with controllable gain. The charge pump phase detector 400 produces pulses of positive or negative current according to the sign of the phase error. The width of a produced current pulse is proportional to the magnitude of the phase error. In response to a digital gain control from the controller 42, the magnitude of a particular current pulse is made proportional to the value of the output divisor N or, alternatively, the reference divisor M.

A digital-to-analog (D/A) converter 402 converts the digital gain control from the controller 42 to an analog current $I_o$. When there are more digital bits used to program the variable values of the divisors N and M than can be used by a limited frequency resolution digital-to-analog converter, only the most significant bits need be connected to such a digital-to-analog converter.

The current $I_o$ generated by the D/A converter 402 is approximately proportional to the divisor ratio (1/N or 1/M) momentarily in use. The current $I_o$ is reflected using a "pull-up", or positive, current mirror 404 or a "pull-down", or negative, current mirror 406 according to the sign of the phase error. The pull-up current mirror 404 is enabled from the time of occurrence of a reference pulse from the reference divider 30 to the time of occurrence of an output pulse from the VCO divider 34 when the output pulse from the VCO divider 34 is deemed late. The pull-down current mirror 406 is enabled from the time of occurrence of an output pulse from the VCO divider 34 to a reference pulse from the reference divider 30 when the reference pulse is deemed to be early.

Two D-type flip-flops 408 and 410 have connected to their respective clock inputs a phase detector input 1 and a phase detector input 2. The "Q" outputs $Q_1$ and $Q_2$ of both flip-flops 408 and 410 are set high. The complementary output $\overline{Q}_1$ of flip-flop 408 is connected to the pull-up current mirror 404 as an enable pull-up signal. Output $Q_2$ of the flip-flop 401 is connected as an enable pull-down signal to the pull-down current mirror 406. Flip-flop outputs $Q_1$ and $Q_2$ from flip-flops 408 and 410, respectively, are also input to an AND gate 412 having an output which resets the flipflops 408 and 410 when both outputs $Q_1$ and $Q_2$ become high together. A phase error current pulse dφ is generated at a connection between a drain of one of the P-type field effect transistors (FETs) in the pull-up current mirror 404 and the drain of one of the N-type FETs in the pull-down current mirror 406. Such a gain-programmable charge pump type of phase detector is further described in U.S. Pat. No. 5,180,993 entitled "Method and Arrangement For Frequency Synthesis" and U.S. Pat. No. 5,095,288 entitled "Phase-Locked Loop Having A Variable Bandwidth", both issued to Dent, the disclosures thereof being incorporated herein by reference. The D to A convertor may be programmed to charge the charge pump current level only during periods when no output current is being generated, i.e. in time for the next current pulse output, thereby avoiding glitches.

The foregoing detailed description shows and describes only certain particular embodiments of the present invention. However, those skilled in the art will recognize that many modifications and variations may be made without departing substantially from the spirit and scope of the present invention. Accordingly, it should be clearly understood that the form of the invention herein is exemplary only and is not intended to limit the scope of the invention as defined in the following claims.

What is claimed is:

1. A frequency synthesizer for generating an output signal having a desired output frequency comprising:
   a reference frequency source for generating a reference signal having a reference frequency;
   a reference divider circuit for dividing the reference signal by a reference divisor M to produce a reference pulse train and for varying the reference divisor M in a predetermined pattern in response to an overflow signal during generation of the desired output frequency;
   an overflow accumulator connected to the output of the reference divider circuit incremented by pulses output from the reference divider circuit, wherein said overflow accumulator generates said overflow signal when the value of the overflow accumulator reaches a predetermined limit; and
   an output signal circuit for generating the output signal having the desired output frequency based on the reference pulse train.

2. The frequency synthesizer as recited in claim 1 wherein the reference divisor M is varied between pulses of the reference pulse train to produce a mean pulse frequency for the reference pulse train having a non-integral relationship to the reference frequency.

3. The frequency synthesizer as recited in claim 1 wherein the output signal circuit comprises:
   an oscillator for generating the output signal at the desired output frequency in response to an output control signal; and
   an output divider circuit for dividing the output frequency by an output divisor N to produce an output pulse train and comparing the output pulse train the reference pulse train and for generating the output control signal based on the comparison.

4. The frequency synthesizer as recited in claim 3 wherein the output divider circuit comprises:
   a phase error detector for comparing the output pulse train and the reference pulse train to produce a phase error signal; and
   a signal processor for processing the phase error signal to produce the output control signal.

5. The frequency synthesizer as recited in claim 4, wherein the signal processor comprises a low-pass loop filter.

6. The frequency synthesizer of claim 4, wherein the signal processor includes a a ripple compensation circuit to compensate for the undesired variations of the reference divisor M.

7. The frequency synthesizer of claim 1, wherein the reference divider circuit varies the reference divisor M between a first preselected integer value and a second preselected integer value in a determined pattern, and further wherein the first and second preselected integer values differ by one.

8. A frequency synthesizer for generating an output signal of a desired output frequency comprising:
   a reference frequency source for generating a reference signal having a reference frequency;
   a reference divider circuit for dividing the reference signal by a reference divisor M and for producing a reference pulse train based on the divided reference signal;
   an output divider for dividing the output signal by an output divisor N and for producing an output pulse train based on the divided output signal;
   a fractional controller for varying values of the reference divisor M and the output divisor N between a first pair of values (N1, M1) and a second pair of values (N2, M2);
   a phase error detector for comparing the reference pulse train and the output pulse train to produce a phase error signal;
   a ripple compensator connected to the phase error detector and controlled by the fractional controller to compensate for periodic phase error in the phase error signal; and
   a signal processor for processing the phase error signal to produce an output control signal; and
   an oscillator for producing the output signal at the desired output frequency in response to the output control signal.

9. The frequency synthesizer of claim 8, wherein the signal processor includes a low-pass loop filter.

10. The frequency synthesizer as recited in claim 8, wherein the fractional controller varies the values of the reference divisor M and the output divisor N between the first and second pairs of values (N1, M1) and (N2, M2) in a determined pattern.

11. The frequency synthesizer of claim 8, wherein said first and second pairs of values define first and second ratios, and wherein the signal processor generates a ripple compensation signal in response to undesired variations of the first and second ratios, and further comprises:
a ripple compensation circuit for combining the phase error signal and the ripple compensation signal to compensate for the undesired variations of the first and second ratios.

12. The frequency synthesizer as recited in claim 11, wherein the ripple compensation signal minimizes any undesired effect of variances in the values of the output or reference divisors N or is M.

13. The frequency synthesizer as recited in claim 8, wherein the ripple compensator minimizes an integral of the periodic phase error.

14. The frequency synthesizer as recited in claim 8, wherein the ripple compensator overcompensates for the periodic phase error.

15. The frequency synthesizer as recited in claim 8, wherein the fractional controller generates a loop gain compensation signal for controlling scaling of the phase error signal generated by the phase error detector.

16. The frequency synthesizer of claim 8, wherein the phase error signal is scaled to minimize variances in the phase error signal.

17. The frequency synthesizer of claim 8, wherein the phase error signal is scaled to minimize periodic variations in the phase error signal caused by varying the values of the output divisor N or the reference divisor M.

18. The frequency synthesizer of claim 8, wherein the phase error signal is scaled based on a current value of either the reference or output divisor M or N.

19. The frequency synthesizer as recited in claim 8, wherein the phase error signal is scaled so that a larger value of the reference divisor M results in a larger correction of the phase error signal.

20. The frequency synthesizer of claim 15, wherein the phase error detector comprises a charge pump phase detector including a pull-up current mirror and a pull-down current mirror for reflecting a current based on the loop gain compensation signal and for generating a negative or positive pulse of current based on a sign of the phase error signal.

21. The frequency synthesizer of claim 20, wherein a width of the pulse of current is based on a magnitude of the phase error signal.

22. The frequency synthesizer of claim 20, wherein a magnitude of the pulse of current is based on the current values of the output and reference divisors N and M.

23. A method for synthesizing a range of desired output frequencies generated by an oscillator which is controlled by a control signal, the method comprising the steps of:
selecting a desired output frequency to be generated by the oscillator;
determining a sequence of integer values that approximates a non-integral factor of a reference frequency;
dividing the reference frequency by the determined sequence of integer values;
accumulating a fractional remainder from the dividing step to control when each of the integer values in the determined sequence is employed in the dividing step;
comparing the divided reference frequency and a signal corresponding to the desired output frequency;
producing an error signal based on the comparison;
processing the error signal to compensate for ripple error in the error signal; and
producing a control signal based on the error signal for controlling the oscillator to produce an output signal having the desired output frequency.

24. The method as recited in claim 23, wherein the integer values are comprised of two integers corresponding to a reference integer M and the reference integer plus ones (M+1).

25. The method as recited in claim 23 further comprising the step of dividing the output signal by an output integer N.

26. The method as recited in claim 25, wherein the value of the output integer N is fixed for a period of time that the desired output frequency is to be generated by the oscillator.

27. The method as recited in claim 25, wherein the value of the output integer N varies in accordance with a predetermined sequence of integers.

28. A method for synthesizing a range of output frequencies generated by an oscillator, comprising the steps of:
selecting a desired output frequency;
dividing a reference frequency by a reference divisor M to generate a reference pulse train;
comparing the reference pulse train to an output pulse train to generate a phase error signal;
processing the phase error signal to produce a control signal for controlling the output frequency of the oscillator;
dividing the output frequency by an output divisor N to obtain said output pulse train;
determining a first pair of integers (N1, M1) having a first ratio therebetween and a second pair of integers (N2, M2) having a second ratio therebetween, said second ratio different from said first ratio; and
periodically alternating said reference divisor M and said output divisor N between said first pair of integer-values (N1, M1) and said second pair of integer values (N2, M2) during generation of the desired output frequency.

29. The method as recited in claim 28, wherein the determining step comprises the step of:
determining a sequence of the first and second pairs of integers (N1, M1) and (N2, M2) which approximates a non-integral factor by which the desired output frequency is related to the reference frequency.

30. The method as recited in claim 29, further comprising the step of:
determining an optimum sequence of the first pair of integers (N1, M1) and the second pair of integers (N2, M2).

31. The method as recited in claim 30, comprising the steps of:
detecting a phase error based on the step of comparing the divided reference frequency and the divided output frequency;
accumulating the phase error; and
determining the values of the first and second pairs of integers (N1, M1) and (N2, M2) and the optimum sequence to reduce the accumulated phase error.

32. The method as recited in claim 28, wherein the step of determining a first pair of integers (N1, M1) and a second pair of integers (N2, M2) comprises the step of determining the values of the first and second pairs of integers (N1, M1) and (N2, M2) in accordance with the following equations:

$$F_{vco}(\text{below}) = (N1/M1) * F_{ref}$$

where $F_{ref}$ is the reference frequency and $F_{vco}(\text{below})$ is close to but less than the desired output frequency, and $$F_{vco}(\text{above}) = (N2/M2) * F_{ref}$$

where $F_{vco}(\text{above})$ is close to but greater than the desired output frequency.

33. The method as recited in claim 28, further comprising the step of accumulating fractional * remainders from the dividing step to control the timing of when each of the first and second pairs of integers is employed in the dividing step.

34. The method as recited in claim 33, further comprising the step of compensating the control signal for the accumulated fractional remainder.

35. The method as recited in claim 28, wherein the step of dividing generates a ripple error in the phase error signal, and the method further comprises the step of compensating the control signal for the ripple error.

36. The method as recited in claim 28, wherein the determining step comprises the steps of:

iteratively determining a phase error for selected ones of the pairs of integers;

determining a phase error for each iteration;

determining an integral of the phase error; and selecting a pair of integers having a minimal integrated phase error.

37. The method as recited in claim 28, wherein the step of determining a first pair of integers vcomprises the step of determining values of the integers M1 and M2 for a minimum phase comparison rate.

38. The method as recited in claim 28, wherein the step of determining a first pair of integers comprises the step of determining values of the integers N1 and N2 for a minimum fractional ripple.

39. The method as recited in claim 28, further comprising the step of generating a gain compensation signal for controlling a gain of the phase error signal.

40. The method as recited in claim 39, wherein the gain compensation signal minimizes any undesired effect of varying the integers N or M.

41. The method as recited in claim 28, further comprising the step of:

scaling the phase error signal to minimize variances in the output frequency.

42. The method in claim 41, wherein the phase error signal is scaled based on a current value of the integers M or N.

43. The method as recited in claim 42, wherein the phase error signal is scaled so that a larger value of the integer M results in a larger magnitude of the phase error signal.

44. The method as recited in claim 28, wherein the determining step comprises the steps of determining a closest Nth cycle of the output frequency to an Mth cycle of the reference frequency as a function of the values of the reference divisor M, the output frequency, the reference frequency, and an expected phase error;

determining a cumulative expected phase error at the Mth cycle of reference frequency as a function of the values of the reference divisor M, the output frequency, the reference frequency, and the expected phase error, and determining the values of the reference divisor M and output divisor N that result in a minimum expected phase error.

45. A frequency synthesizer for generating an output signal of a selected one of a plurality of output frequencies, comprising:

a voltage controlled oscillator (VCO) for producing the output signal;

an output divider for selecting an output divisor N being based on the selected one of the output frequencies and being constant during generation of the selected one of the output frequencies, for dividing the output signal by the output divisor N and for generating an output pulse train based on the division of the output signal;

a reference divider for dividing a reference signal at a reference frequency by a reference divisor M, the reference divisor M being varied between two or more integer values on successive division cycles during generation of the selected one of the output frequencies in a predetermined pattern; and a phase error detector for generating a phase error signal for continuously adjusting the output frequency of the VCO based on the output pulse train and a reference pulse train, wherein the phase error signal is further reduced by combining the phase error signal with a similar but opposing signal which is computed from a ratio of the selected one of the desired output frequencies $F_{VCO}$ to the reference frequency $F_{ref}$ to satisfy the equation, $$\frac{A1*M1 + A2*M2 + \ldots + Ai*Mi}{N*(A1 + A2 + \ldots + Ai)} = \frac{F_{ref}}{F_{VCO}}$$

where M1, M2 . . . Mi represent i different values for the reference divisor M used by the reference divider during production of the selected one of the output frequencies $F_{VCO}$ and A1, A2 . . . Ai represent a corresponding number of times that each value of the reference divisor M is used in one cycle of the predetermined pattern.

46. The frequency synthesizer as recited in claim 45, wherein the predetermined pattern is predetermined to reduce undesired spectral components of the phase error signal generated by the phase comparator.

47. A frequency synthesizer for generating an output signal of a selected one of a plurality of output frequencies $F_{VCO}$, comprising:

a voltage controlled oscillator (VCO) for producing the output signal;

an output divider for selecting an output divisor N being based on the selected one of the output frequencies and being constant during generation of the selected one of the output frequencies, for dividing the output signal by the output divisor N and for generating an output pulse train based on the division of the output signal;

a reference divider for dividing a reference signal at a reference frequency $F_{REF}$ by a reference divisor M, and for generating a reference pulse train based on the division of the reference signal, the reference divisor M being varied between two or more integer values on successive division cycles during generation of the selected one of the output frequencies in a predetermined pattern;

a modulo-Q accumulator based on an integer Q and being modulo-Q incremented or decremented on each count cycle of the reference and output dividers by an integer X, and wherein, the value of the reference divisor M used on the particular one of the successive division cycles is a reference integer M or the reference integer plus one (M+1) based whether the modulo-Q accumulator overflows or underflows on a last accumulation cycle; and a phase error detector for generating a phase error signal for continuously adjusting the output frequency $F_{VCO}$ of the VCO based on the output pulse train and the reference pulse train.

48. The frequency synthesizer as recited in claim 47, wherein the phase error detector compares phases of the reference pulse train and the output pulse train, and wherein the value of the reference divisor M is selected based on a desired frequency of phase comparisons.

49. The frequency synthesizer as recited in claim 48, wherein the output divisor N is determined in accordance with the following equation:

$$M*(F_{vco}/F_{ref}) \leq N \geq (M+1)*(F_{vco}/F_{ref})$$

where $F_{vco}$ is the selected one of the output frequencies and $F_{ref}$ is the reference frequency.

50. The frequency synthesizer as recited in claim 47, wherein the integer Q is determined in accordance with the following:

$$Q = F_{vco}/C,$$

where C is a common factor of the selected one of the output frequencies $F_{vco}$ and the reference frequency $F_{ref}$.

51. The frequency synthesizer as recited in claim 50, wherein the common factor C is a highest common factor of the selected one of the output frequencies $F_{vco}$ and the reference frequency $F_{ref}$.

52. The frequency synthesizer as recited in claim 47, wherein the integer X is determined in accordance with the following equation:

$$X = M*((N-(INT(M*F_{vco}/F_{ref}))*(d-n)),$$

where d and n are a denominator and numerator, respectively, of a fractional part of the selected one of the output frequencies $F_{vco}$, expressed in units of the reference frequency $F_{ref}$ divided by the reference integer M as follows:

$$F_{vco} = (INT(M*F_{vco}/F_{ref}))*(F_{ref}/M)+(n/d)*(Fref/m)$$

where INT means "integer part of".

53. A frequency synthesizer as recited in claim 45, wherein the value of the output divisor N is selected for each selected one of the output frequencies to obtain an optimal ripple error.

54. A frequency synthesizer comprising:
a voltage controlled oscillator (VCO) for generating an output signal at an output frequency;
an output divider for dividing the output frequency by an output integer N to produce an output pulse train;
a reference divider for dividing a reference frequency by a reference integer M to produce a reference pulse train;
a phase comparator for comparing the reference and output pulse trains, for generating a phase error signal based on the comparison and for controlling the VCO to produce a desired output frequency based on the phase error signal; and
a controller for varying the output integer N and the reference integer M on successive division cycles of the output divider or the reference divider between two pairs of integers (N1, M1) and (N2, M2) calculated such that N1*$F_{ref}$/M1 and N2 *$F_{ref}$/M2, where $F_{ref}$ is the reference frequency, are best approximations, respectively, of frequencies less than and greater than the desired output frequency.

55. The frequency synthesizer as recited in claim 54, wherein the values of the output and reference integers N and M are alternated between the two pairs of integers (N1, M1) and (N2, M2) in a cyclic pattern which minimized deviation of phase of the output signal from an ideal phase of the output signal at the desired output frequency.

56. A frequency synthesizer as recited in claim 54, wherein the integers N and M both vary on successive division cycles.

57. The frequency synthesizer as recited in claim 56, wherein the pairs of integers N and M are assigned values in a cyclic pattern designed to minimize any phase error of the output signal.

58. The frequency synthesizer as recited in claim 54, wherein variation of a gain of a control loop comprising the VCO, the phase comparator, and the output divider due to variation in the value of the output or reference integer N or M is reduced by weighting the phase error signal from the phase detector in proportion to the output or reference integer N or M.

59. The frequency synthesizer as recited in claim 54, wherein values of the output integer N and the reference integer M are constrained.

60. The frequency synthesizer as recited in claim 59, wherein the values of the output integer N and the reference integer M are each constrained between maximum and minimum values.

61. The frequency synthesizer as recited in claim 59, wherein one or more unacceptable values are determined for the values of the output integer N and the reference integer M.

62. A frequency synthesizer for generating an output signal of a desired output frequency comprising:
a reference frequency source for generating a reference signal having a reference frequency;
a reference divider circuit for dividing the reference signal by a reference divisor M and for producing a reference pulse train based on the divided reference signal;
a fractional controller for varying values of the reference divisor M and an output divisor N between a first pair of values (N1, M1) and a second pair of values (N2, M2), wherein the first and second pair of values (N1, M1) and (N2, M2) are selected such that a first ratio of the first pair of values is a close fractional approximation less than a ratio of the desired output frequency and the reference frequency and that a second ratio of the second pair of values is a close fractional approximation greater than the ratio of the desired output frequency and the reference frequency; and
an output processing circuit for generating the output signal based on the reference pulse train and an output pulse train; and
an output divider for dividing the output signal by the output divisor N and for producing the output pulse train based on the divided output signal.

* * * * *